United States Patent
Gifford et al.

(10) Patent No.: US 9,268,637 B2
(45) Date of Patent: Feb. 23, 2016

(54) MEMORY CIRCUIT INCORPORATING ERROR DETECTION AND CORRECTION (EDAC), METHOD OF OPERATION, AND SYSTEM

(71) Applicant: SILICON SPACE TECHNOLOGY CORPORATION, Austin, TX (US)

(72) Inventors: David R. Gifford, Pflugerville, TX (US); Kevin E. Atkinson, Chanhassen, MN (US); James A. Jensen, Eagan, MN (US)

(73) Assignee: SILICON SPACE TECHNOLOGY CORPORATION, Austin, TX (US)

( * ) Notice: Subject to any disclaimer, the term of this patent is extended or adjusted under 35 U.S.C. 154(b) by 52 days.

(21) Appl. No.: 14/214,800

(22) Filed: Mar. 15, 2014

(65) Prior Publication Data
US 2014/0281810 A1    Sep. 18, 2014

Related U.S. Application Data

(60) Provisional application No. 61/801,853, filed on Mar. 15, 2013.

(51) Int. Cl.
G06F 11/00 (2006.01)
G06F 11/10 (2006.01)
G06F 11/14 (2006.01)

(52) U.S. Cl.
CPC ......... *G06F 11/106* (2013.01); *G06F 11/1076* (2013.01); *G06F 11/1096* (2013.01); *G06F 11/14* (2013.01)

(58) Field of Classification Search
CPC ............. G06F 11/106; G06F 11/1008; H03M 13/2942; H03M 13/6561
See application file for complete search history.

(56) References Cited

U.S. PATENT DOCUMENTS

| | | | |
|---|---|---|---|
| 6,009,548 A * | 12/1999 | Chen et al. | 714/762 |
| 6,044,483 A * | 3/2000 | Chen et al. | 714/762 |
| 6,414,360 B1 | 7/2002 | Gardner | |
| 6,511,893 B1 | 1/2003 | Woodruff et al. | |
| 6,570,234 B1 | 5/2003 | Gardner | |
| 6,573,774 B1 | 6/2003 | Gardner | |

(Continued)

OTHER PUBLICATIONS

Clive Maxfield, Xilinx space-grade SRAM-based Virtex-5QV FPGA in production with Mega-Rad capability, EE Times (http://www.eetimes.com), Jul. 21, 2011, 2 pgs.

(Continued)

*Primary Examiner* — Esaw Abraham
(74) *Attorney, Agent, or Firm* — Howison & Arnott, LLP

(57) ABSTRACT

An example integrated circuit includes a first memory array including a first plurality of data groups, each such data group including a respective plurality of data bits. The integrated circuit also includes a first error detection and correction (EDAC) circuit configured to detect and correct an error in a data group read from the first memory array. The integrated circuit also includes a first scrub circuit configured to access in a sequence each of the first plurality of data groups to correct any detected errors therein. Both the first EDAC circuit and the first scrub circuit include spatially redundant circuitry. The first EDAC circuit and the first scrub circuit may include buried guard ring (BGR) structures, and may include parasitic isolation device (PID) structures. The spatially redundant circuitry may include dual interlocked storage cell (DICE) circuits, and may include temporal filtering circuitry.

14 Claims, 28 Drawing Sheets

(56) References Cited

U.S. PATENT DOCUMENTS

| | | | |
|---|---|---|---|
| 6,715,116 | B2 | 3/2004 | Lester et al. |
| 6,845,472 | B2 | 1/2005 | Walker et al. |
| 6,848,063 | B2 | 1/2005 | Rodeheffer et al. |
| 6,917,533 | B2 | 7/2005 | Gardner et al. |
| 7,043,679 | B1 * | 5/2006 | Keltcher et al. ............... 714/763 |
| 7,071,749 | B2 | 7/2006 | Gardner |
| 7,134,069 | B1 * | 11/2006 | Longwell et al. ............. 714/800 |
| 7,263,631 | B2 | 8/2007 | VanBuren |
| 7,275,130 | B2 | 9/2007 | Klein |
| 7,518,218 | B2 | 4/2009 | Gardner |
| 7,576,557 | B1 | 8/2009 | Tseng et al. |
| 7,930,662 | B1 | 4/2011 | Sundararajan et al. |
| 8,028,216 | B1 * | 9/2011 | Yeo et al. ....................... 714/755 |
| 8,972,819 | B2 | 3/2015 | Morris et al. |
| 2006/0036909 | A1 | 2/2006 | VanBuren |
| 2006/0218455 | A1 | 9/2006 | LeClair et al. |
| 2008/0188045 | A1 | 8/2008 | Morris |
| 2009/0006899 | A1 * | 1/2009 | Gara et al. ....................... 714/42 |
| 2010/0026338 | A1 | 2/2010 | Fulcomer |
| 2010/0127314 | A1 | 5/2010 | Frach |
| 2010/0269022 | A1 | 10/2010 | Clark et al. |
| 2011/0107158 | A1 | 5/2011 | Espinosa et al. |
| 2013/0166990 | A1 | 6/2013 | Morris et al. |
| 2015/0169400 | A1 | 6/2015 | Morris et al. |

OTHER PUBLICATIONS

Texas Instruments, 16-Mb Radiation-Hardened SRAM, Texas Instruments (http://www.ti.com), Jun. 2011 (Revised Jul. 2011), 24 pgs., SMV512K32-SP, Dallas, Texas.

Leonard Rockett, Radiation Hardened CMOS Technologies using Buried Power Grids, TechOnline (http://www.techonline.com), Mar. 20, 2012, 26 pgs.

Jim Hoff, et al., SEU Tolerance of Different Register Architectures in a 0.25 um CMOS Process, presented at the Fifth International Meeting on Frontend Electronics, Snowmass, Colorado, Jun. 2003, 52 pgs.

L.W. Massengill, et al., Single Event Mechanisms Impacting Sub-100nm Radiation-Hardened Design, presented at the GOMAC Tech Conference, Lake Buena Vista, Florida, Mar. 2007, 20 pgs.

Silicon Space Technology, HardSIL™, HardSIL SRAMS, presented at HiTEC, Albuquerque, New Mexico, May 2012, 35 pgs.

R. Lowther, et al., Latchup Immunity in High Temperature Bulk CMOS Devices, presented at HiTEN, Jul. 2011, Paper (6 pgs.) and accompanying slide presentation (28 pgs.).

Misao Higuchi, et al., Non-Volatile and Fast Static Memories, An 85ns 16Mb CMOS EPROM with Alterable Word Organization, Solid-State Circuits Conference, 1990, Digest of Technical Papers. 37th ISSCC., 1990 IEEE International, (3 pgs.).

PCT: International Search Report of PCT/US2012/066430; Sep. 30, 2013, (6 pgs.).

Bauer, B. et al., "Next Generation 16Mbit RadHard-by-Design SRAM for Military Space Applications," Proceedings of GOMACTech-06, Mar. 22, 2006, pp. 82-85.

Calin. T. et al., "Upset Hardened Memory Design for Submicron CMOS Technology," IEEE Transactions on Nuclear Science, vol. 43, No. 6, Dec. 1996, pp. 2874-2878.

Chen, Po-Yuan et al., "An Enhanced EDAC Methodology for Low Power PSRAM," IEEE International Test-Conference (ITC'06), Paper 30.3, Ocl. 2006, pp. 1-10.

Coloma, Bernard et al., "High Speed 15 ns 4 Mbits SRAM for Space Application," Proceedings of 2002 IEEE International Workshop on Memory Technology, Design and Testing (MTDT 2002),5 pages.

Hafer, Craig et al., "Commercially Fabricated Radiation Hardened 4Mbit SRAM," Proceedings of 2004 IEEE Aerospace Conference, 2004, pp. 2277-2283.

Hafer, Craig et al., "Next Generation Radiation-Hardened SRAM for Space Applications," IEEE Aerospace Conference, paper #1495, Version 2, 2006, pp. 1-8.

Hafer, Craig et al., "SEE and TID Results for a RadHard-by-Design 16Mbit SRAM with Embedded EDAC," IEEE Radiation Effects Data Workshop, Jul. 2006, pp. 131-135.

Kalter, Howard L. et al., "A 50-ns. 16-Mb DRAM with a 10-ns Data Rate and On-Chip ECC," IEEE Journal of Solid-State Circuits, vol. 25, No. 5, Ocl. 1990, pp. 1118-1127.

Arimoto, Kazutami et ai, "A Speed-Enhanced DRAM Array Architecture with Embedded ECC," IEEE Journal of Solid-State Circuits, vol. 25, No. 1, Feb. 1990, pp. 11-17.

Lam, Duncan Yu et al., "SEE-Hardened-by-Design Area-Efficient SRAMS," IEEE Aerospace Conference Paper No. 7.0304, Mar. 5-12, 2005, pp. 1-7.

Li, Jin-Fu and Huang, Yu-Jane, "An Error Detection and Correction Scheme for RAMs with Partial-Write Function," Proceedings of the 2005 IEEE International Workshop on Memory Technology, Design and Testing (MTDT'05), Aug. 2005, pp. 115-120.

Mavis, D.G. et al., "Multiple Bit Upsets and Error Mitigation in Ultra-Deep Submicron SRAMS," IEEE Transactions on Nuclear Science, vol. 55, No. 6, Dec. 2008, pp. 3288-3294.

Radaelli. Daniele et al.. "Investigation of Multi-Bit Upsets in a 150 nm Technology SRAM Device." IEEE Transactions on Nuclear Science. vol. 52. No. 6, Dec. 2005, pp. 2433-2437.

Sasada, T. et al., "Measurement of Single-Event Effects on a Large Number of Commercial DRAMs," IEEE Transactions on Nuclear Science, vol. 53, No. 4, Aug. 2006, pp. 1806-1812.

Suzuki, Toshikazu et al., "0.3 to 1.5V Embedded SRAM with Device-Fluctuation-Tolerant Access-Control and Cosmic-Ray-Immune Hidden-ECC Scheme," IEEE International Solid-State Circuits Conference (ISSCC 2005) Session 26, Static Memory, 26.6, Feb. 9, 2005, pp. 484-485, 612.

Yoshimoto, S. et al., "Multiple-Bit-Upset and Single-Bit-Upset Resilient 8T SRAM Bitcell Layout with Divided Wordline Structure," IEEE 17th International On-Line Testing Symposium, 2011, pp. 151-156.

* cited by examiner

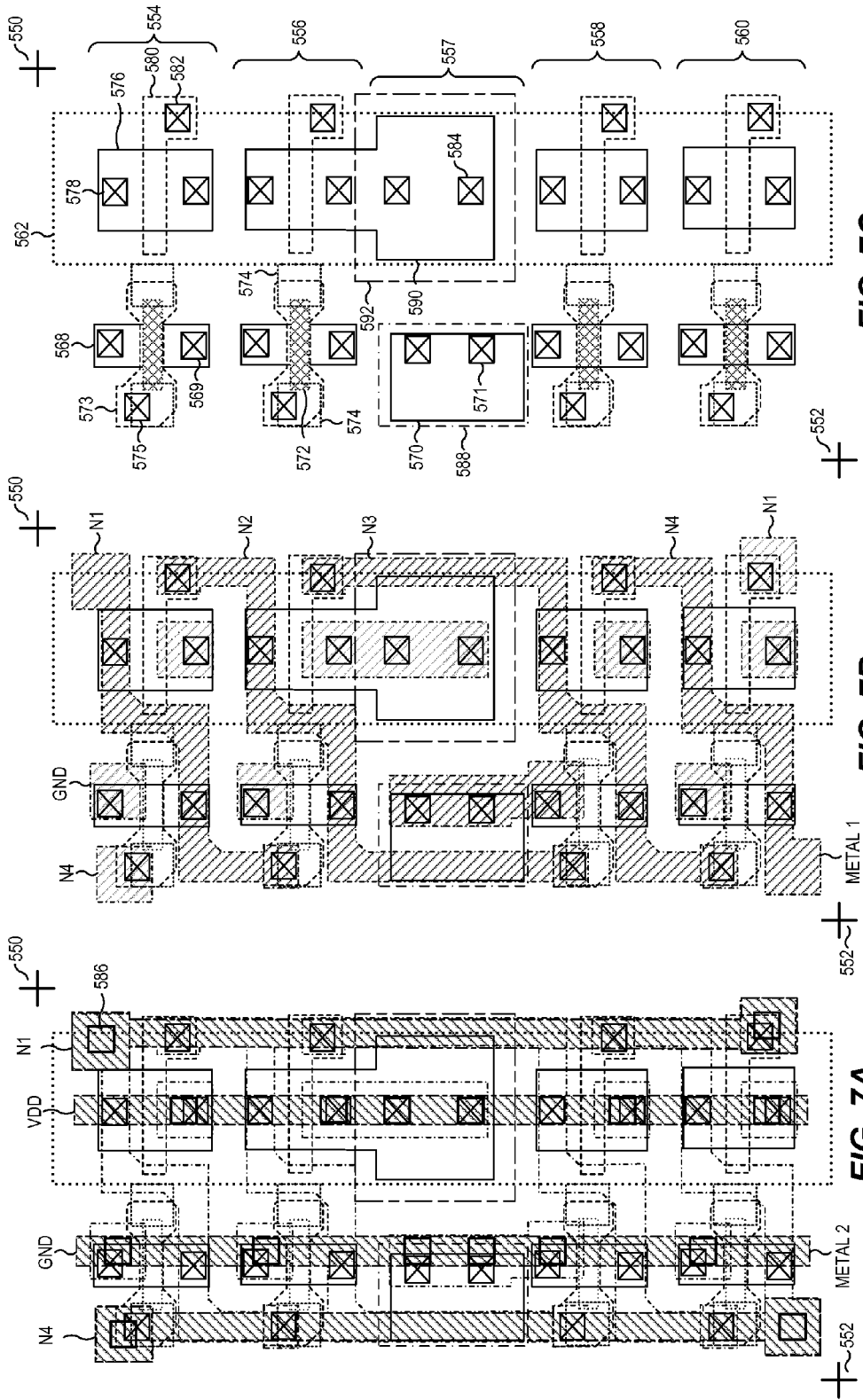

SSTC-32107

REPLACEMENT SHEET

FIG. 13

SYSTEM/ONE SCRUB ENGINE VS. ON-CHIP SCRUB SDRAM EXAMPLE

| SST 256Mb (16Mx16) DDRII-800 | SYSTEM BASED SCRUB (OFF-CHIP SCRUB WITH 4 WORD BURST CYCLE) | | | | | | SST 256Mb (16Mx16) SDRAM WITH ON-CHIP SCRUB (USING 4 SCRUB ENGINES ON EACH CHIP) | | | | | |
|---|---|---|---|---|---|---|---|---|---|---|---|---|
| SCRUB FREQUENCY (Hz) | 2.0E+07 | 1.0E+07 | 5.0E+06 | 1.0E+06 | 1.0E+05 | | 1.3E+06 | 6.3E+05 | 3.1E+05 | 6.3E+04 | 6.3E+03 | |
| SCRUB PERIOD (s) | 5.0E-08 | 1.0E-07 | 2.0E-07 | 1.0E-06 | 1.0E-05 | | 8.0E-07 | 1.6E-06 | 3.2E-06 | 1.6E-05 | 1.6E-04 | |
| # WORDS PER MODULE (M) | | | | | | | # SST CHIPS "HIGH" FOR ADDRESS SPACE | 2 | 8 | 16 | | |
| | | | | | | | # ADDRESSES SCRUBBED IN PARALLEL | 8 | 32 | 64 | | |
| | | TIME TO SCRUB ENTIRE ADDRESS SPACE ONCE (s) | | | | | | TIME TO SCRUB ENTIRE ADDRESS SPACE ONCE (s) | | | | |
| 32 | 0.42 | 0.84 | 1.68 | 8.39 | 83.89 | | 3.36 | 6.71 | 13.42 | 67.11 | 671.09 | |
| 128 | 1.68 | 3.36 | 6.71 | 33.55 | 335.54 | | 3.36 | 6.71 | 13.42 | 67.11 | 671.09 | |
| 256 | 3.36 | 6.71 | 13.42 | 67.11 | 671.09 | | 3.36 | 6.71 | 13.42 | 67.11 | 671.09 | |
| DDR-II MEMORY MODULE (MB) | % "OFF-LINE" FOR SCRUB | | | | | | | | | | | |
| 256 | 55.00% | 27.50% | 13.75% | 2.75% | 0.28% | | 3.44% | 1.72% | 0.86% | 0.17% | 0.02% | |
| 1024 | 0.96% | 0.96% | 0.96% | 0.96% | 0.96% | | 0.96% | 0.96% | 0.96% | 0.96% | 0.96% | |
| 2048 | | | | | | | | | | | | |
| | % "OFF-LINE" FOR REFRESH | | | | | | | | | | | |
| | TOTAL % "OFF-LINE" | 55.96% | 28.46% | 14.71% | 3.71% | 1.24% | | 4.40% | 2.68% | 0.96%→0.96% | 0.96%→0.96% | 0.96%→0.96% |

POSSIBLE TO MERGE REFRESH AND SCRUB FUNCTIONS

2GB (2048MB) MEMORY OVERHEAD FOR SCRUB AND REFRESH

- ADVANTAGES OF ON-CHIP SCRUB INCREASE AS MEMORY ADDRESS SPACE GROWS
- ON-CHIP SCRUB RESULTS IN LOWER OVERHEAD COMPARED TO SYSTEM BASED SCRUB WHILE MAINTAINING SAME TIME TO SCRUB ENTIRE ADDRESS SPACE
- OVERHEAD FOR ON-CHIP SCRUB CAN BE COMPLETELY ELIMINATED IF SCRUB MERGED INTO REFRESH CYCLE

MEMORY CIRCUIT INCORPORATING ERROR DETECTION AND CORRECTION (EDAC), METHOD OF OPERATION, AND SYSTEM

CROSS-REFERENCE TO RELATED APPLICATIONS

This application claims benefit of U.S. Provisional Application No. 61/801,853, filed Mar. 15, 2013, entitled MEMORY CIRCUIT INCORPORATING ERROR DETECTION AND CORRECTION (EDAC), METHOD OF OPERATION, AND SYSTEM, the specification of which is incorporated by reference herein in its entirety.

TECHNICAL FIELD

The present invention relates to integrated circuits, and particularly to integrated circuits with partial and/or complete immunity to failure modes associated with radiation exposure, and even more particularly to radiation hardening of integrated circuits including a memory array.

DESCRIPTION OF THE RELATED ART

CMOS circuits are enormously important to modern society as these devices are used to operate and control nearly every facet of daily life. CMOS circuits are relied upon to build up the electronic components which control critical electronic systems used to control commercial aircraft, automobiles, medical equipment, embedded medical devices, industrial machinery, high speed trains, oil well drilling equipment, communication networks, satellites, and defense systems, to name a few. The common denominator that is critical for all the CMOS circuit components used in the aforementioned electronic equipment is error-free operation. Additionally, as CMOS circuits scale down to smaller and smaller critical dimensions and the operation voltage is reduced, the sensitivity to "soft errors" which stem from radiation single event effects (SEE) is increasing. CMOS circuits now have to be carefully chosen for system use with consideration given to the physical operating environment and its reliability to SEE in those particular environments. Digital electronics critically depend on binary values (i.e., a digital "0" or "1") for each critical bit of an instruction word. For modern software and hardware systems, each instruction word may include up to 32 (or more) individual state bits, each of which can take on the value of either 0 or 1.

A modern microprocessor will execute each distinct instruction word as it computes the program instructions in sequence. The software program instructions are coded into their digital values (binary 0 and 1) by the system compiler (software) before execution by the digital hardware to yield an output value. As such, properly maintaining each 0 or 1 bit value used in digital word is critically important for reliable system behavior. It is in the context of critical binary bit state that the importance "soft errors" now becomes more apparent.

Certain extreme environments (where CMOS circuits need to operate) exist which will significantly increase the risk for individual bit errors, which in turn can significantly affect the reliability of the electronic control system. These extreme environments are principally:

System operating temperature ranging from extreme cold (−55 C) to extreme hot (200 C);
Supply voltage variations (+/−20%) used to power the system; and
Radiation effects (heavy ion, neutron, proton, electron, gamma ray, cosmic ray).

A majority of CMOS integrated circuits operate in non-extreme environments and thus are not at high risk for soft errors and are known to operate reliably. Most commercial semiconductor manufacturers rate the reliability of their CMOS circuit components at 20 FITS or less. The Failure-In-Time (FIT) is the industry benchmark for reliability. A processor rated at 20 FITs would be expected to execute one billion instructions with no more than 20 instruction failures. In this context, time is an indeterminate value and the quotient (20 FITS) is rather the number of instruction failures (ranging from 0 to 20) which would be expected to occurring for 1 billion executed digital words in a particular chip. The time enters into the context as a function of how long it would take to execute 1 billion instructions for a particular chip. As electronic systems range in performance from slow to high, the time between failures can vary from seconds to much longer periods. However, for CMOS circuits which operate in extreme environments, the FIT rates are dramatically increased to the extent that acceptable (error-free) reliable operation becomes nearly impossible. CMOS chips operating in such extreme environments need to be better designed, and the silicon isolation performance needs to be better engineered, to avoid both a single-bit failure or logic network failure which can stem from similar physical electrical effects.

SUMMARY

A method of storing and retrieving data in a memory circuit providing error detection and correction (EDAC) is provided. In some embodiments, the method includes receiving a plurality of data bits to be written and a plurality of parity bits corresponding to the data bits; parity checking the plurality of data bits and the plurality of parity bits for any parity errors; then EDAC encoding a plurality of check bits corresponding to the plurality of data bits, then storing the plurality of data bits and corresponding plurality of check bits as a first data group in a memory array without storing the plurality of parity bits in the memory array. The method also includes retrieving the first data group from the memory array; EDAC decoding the retrieved first data group to provide an error-free corrected plurality of data bits corresponding to the retrieved first data group; computing a plurality of parity bits corresponding to the corrected plurality of data bits; then conveying the corrected plurality of data bits and corresponding plurality of parity bits to a requesting computational block.

In some embodiments the plurality of data bits represents an external data word having a narrower word width than the data group into which the plurality of data bits is stored, and for which the plurality of check bits corresponds.

In some embodiments the method also includes receiving a second plurality of data bits to be written and a corresponding second plurality of parity bits; parity checking the second plurality of data bits and the second plurality of parity bits for any parity errors; reading the first data group from the memory array; merging the second plurality of data bits into a portion of the first data group together with the first plurality of data bits; EDAC encoding the plurality of check bits corresponding to the merged first data group; then storing the merged data group with corresponding plurality of check bits into the memory array, without storing the second plurality of parity bits in the memory array.

In some embodiments the method also includes periodically scrubbing the memory array to correct any accumulated errors from the memory array.

A memory circuit is also provided. In some embodiments, the memory circuit is operable to perform any of the methods described above. A system is also provided. In some embodiments, the system includes a memory circuit operable to perform any of the methods described above, and a computational block coupled to convey data to and retrieve data from the memory circuit.

In some embodiments, a memory circuit includes a memory array; a parity check circuit operable to check for parity errors in a plurality of data bits and a corresponding plurality of parity bits received by the memory circuit; an EDAC encoder circuit operable to generate a plurality of check bits corresponding to the plurality of data bits; a write driver circuit operable to store the plurality of data bits and corresponding plurality of check bits as a first data group in the memory array; a read circuit operable to retrieve the first data group from the memory array; an EDAC decoder circuit operable to provide an error-free corrected plurality of data bits corresponding to the retrieved first data group; and a parity encoder circuit operable to compute a plurality of parity bits corresponding to the corrected plurality of data bits.

In some embodiments the memory circuit includes a scrub circuit coupled to the EDAC decoder circuit, and operable to periodically scrub accumulated errors from the memory array.

In some embodiments, various portions of the memory circuit each includes one or more of buried guard ring (BGR) structures, parasitic isolation device (PID) structures, and spatially redundant circuitry. In some embodiments, the spatially redundant circuitry includes a triple mode redundancy (TMR) circuit. The TMR circuit may include temporal filtering. In some embodiments, the spatially redundant circuitry includes a dual interlocked storage cell (DICE) circuit. The DICE circuit may include temporal filtering.

In an example embodiment, a computer readable storage media includes data structures encoding an aspect of an integrated circuit that includes a first memory array operable as noted above.

The inventive aspects described herein are specifically contemplated to be used alone as well as in various combinations. The invention in several aspects is contemplated to include circuits (including integrated circuits), related methods of operation, methods for making such circuits, systems incorporating same, and computer-readable storage media encodings of such circuits and methods and systems, various embodiments of which being described herein in greater detail, and as set forth in the appended claims.

The foregoing is a summary and thus contains, by necessity, simplifications, generalizations and omissions of detail. Consequently, those skilled in the art will appreciate that the foregoing summary is illustrative only and is not intended to be in any way limiting of the invention. It is only the claims, including all equivalents, in this or any non-provisional application claiming priority to this application, that are intended to define the scope of the invention(s) supported by this application.

BRIEF DESCRIPTION OF THE DRAWINGS

For a more complete understanding, reference is now made to the following description taken in conjunction with the accompanying Drawings.

FIGS. 7A, 7B, and 7C together show an example layout of a core portion of a DICE-style latch cell.

FIG. 13 is a chart depicting the performance improvement achievable using one or more EDAC circuits in each memory circuit of a memory system, as shown in FIG. 12.

The use of the same reference symbols in different drawings indicates similar or identical items.

DETAILED DESCRIPTION

Figure 1B:
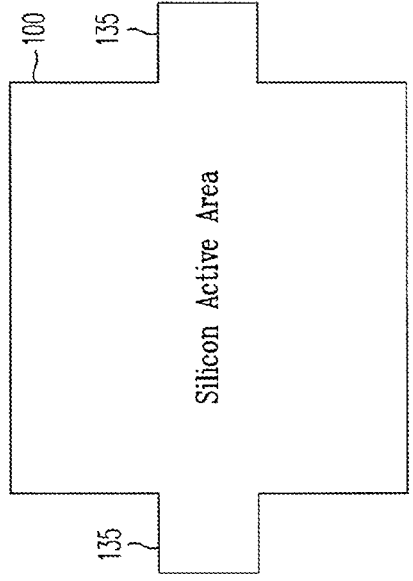
FIGS. 1A-1H show simplified block diagrams of a transistor structure incorporating an example parasitic isolation device (PID) structure.
Figure 1D:
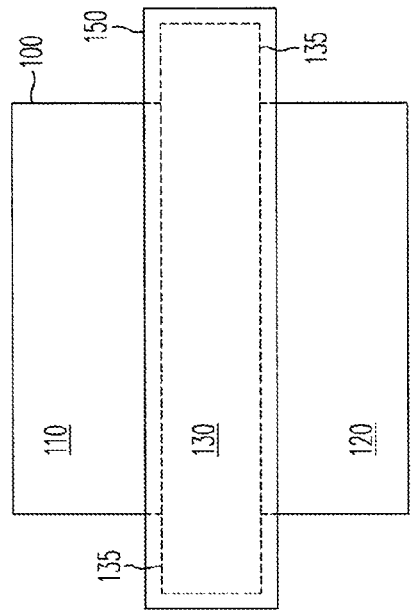
Figure 1A:
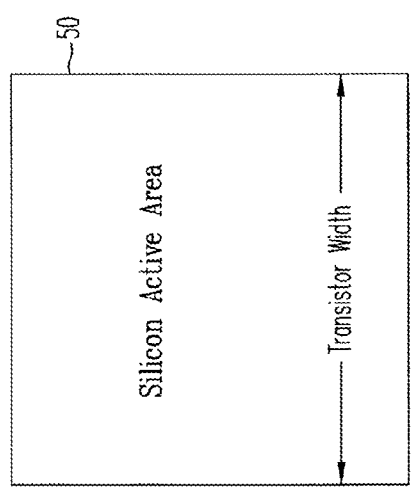
Figure 1C:
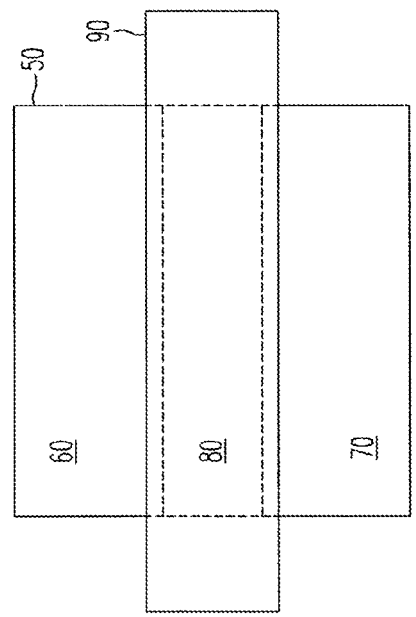

Various structures and techniques are described that each generally provide some manner of protection from one or more of the degradation effects associated with radiation, and particularly ionizing radiation. When combined, these structures and techniques provide novel radiation hardened process isolation (RHPI) schemes. When integrated into a CMOS process silicon structure, the RHPI structures can significantly reduce the sensitivity of the silicon electrical devices to ionizing radiation, single event latch up, and single event soft error. The RHPI structures can generally be applied to any MOS or BiCMOS silicon process and will directly improve radiation hardening properties of the integrated circuit both during and after exposure to a radiation environment. Moreover, this is accomplished with little or no penalty to circuit size and or electrical performance. As such, the RHPI schemes can be used as an "add on" feature, which can be applied to existing MOS or BiCMOS process technology, improving radiation isolation properties without the need for extensive process or circuit changes. The RHPI structures enable radiation hardening of commercial digital process by leveraging existing solid state processing technology and re-use of leading edge circuit IP for the creation of radiation hardened circuit product.

Ionizing radiation occurs naturally in the form of high-energy photons or charged particles that possess enough energy to break atomic bonds and create electron hole pairs in an absorbing material. These particles can include protons, electrons, atomic ions, and photons with energies greater than a bandgap of the absorbing material. When typical integrated circuits, such as CMOS integrated circuits, are exposed to the charged particles over a period of months or even years, the ionizing radiation can contribute to a total ionizing dose (TID). For example, as an ionizing particle passes through a MOS device, it generates one or more electron-hole pairs which can be trapped in the gate oxides and the field oxides. Electrons in the semiconductor's valence band are raised to the conduction band. A fraction of the electron-hole pairs will undergo initial recombination and cause no damage, but such recombination decreases as the electric field increases, and the electrons and holes that survive it are free to diffuse and drift within the oxide where they will be swept from the insulator, recombine, or be trapped.

Mobile electrons typically move through both gate and field oxides quickly, but the holes have a relatively low effective mobility and are easily trapped in gate oxides and field oxides. Because the trapped holes create a positive oxide charge, the resulting space-charge fields cause negative shifts in the threshold voltages of corresponding transistors. As a threshold voltage shifts negatively, a transistor biased in the off-state lets more and more current pass. If enough holes are trapped, an n-channel transistor will remain fully conducting even with zero applied gate bias, causing, for example, an enhancement-mode device to become a depletion-mode device. In many cases, the edge or field region of the device becomes depletion-mode. Should that happen, leakage currents passing around a device (or from device to device) can cause parameter degradation and, ultimately, device and circuit failure.

Ionizing radiation also boosts the interface trap density in MOS structures. Interface traps are localized electronic states close to the interface between silicon and silicon dioxide and can exchange charge with the silicon conduction and valence bands. They shift threshold voltage and can also degrade mobility by acting as scattering centers. More specifically, the increase in interface states shifts the threshold voltages in the negative direction (more depletion $V_t$) for n-channel devices and in the positive direction (more enhancement $V_t$) for p-channel devices. In addition to the positive oxide shift and the interface states shift described above with respect to n-channel and p-channel devices, threshold voltage shifts caused by ionizing radiation further affect parasitic MOS elements, giving rise, for example, to leakage currents that may cause parametric failure and/or functional failure.

Even more specialized devices can be susceptible to TID. For example, SOI transistors can also be affected by TID through charge buildup in the insulator such as a buried oxide. For partially depleted transistors, charge buildup can invert the back surface causing a source-to-drain (back-channel) leakage current. Moreover, this leakage current is relatively unaffected by gate bias. For fully-depleted transistors, there is significant sensitivity to radiation-induced oxide and interface-trap charge buildup. Positive oxide charge buildup tends to deplete the back-channel interface causing a decrease in the threshold voltage of the front-channel gate oxide and increased back-channel leakage current. Thus, a wide variety of threshold voltage instabilities can result.

Thus, the effects of ionizing radiation lead to the degradation of performance and ultimate failure of the CMOS devices. The additional radiation-induced interface states degrade the circuit performance by reducing the channel mobility, which as a result decreases channel conductance and transistor gain. Over time, the threshold voltages of the n-channel and p-channel devices may shift to such a degree where the n-channel transistors cannot be turned off and the drive capability of the p-channel transistors is not sufficient for the circuit to continue operating at the system clock rate. Such a shift in threshold voltages of either the n-channel or p-channel transistors can cause a circuit to fail.

PID Structures

FIGS. 1A-1H illustrate a technique for addressing the parasitic effects associated with TID in a conventional MOS device. Transistor 100 (shown in FIGS. 1B and 1D-1H) differs from conventional MOS devices (shown in FIGS. 1A and 1C) in that channel region 130 of transistor 100 includes two channel region extensions 135. In traditional MOS devices like transistor 50, source (60), drain (70), and channel regions (80) are typically fabricated to have approximately the same width as shown. However, as shown in FIGS. 1B and 1D-1H, source region 110 and drain region 120 have approximately the same widths while channel region 130 has a greater width leading to channel region extensions 135 that extend beyond the edges of the source and drain regions, i.e., beyond the channel region's typical interfaces with each of the source and drain regions. Channel region extensions 135 are typically formed by an extension of the silicon active area from which the source, drain, and channel regions are formed, or by formation of mesa regions immediately adjacent to the channel region. Because of their role in reducing the parasitic effects associated with TID, these extended active area structures can be referred to as parasitic isolation devices (PIDs).

Figure 1E:
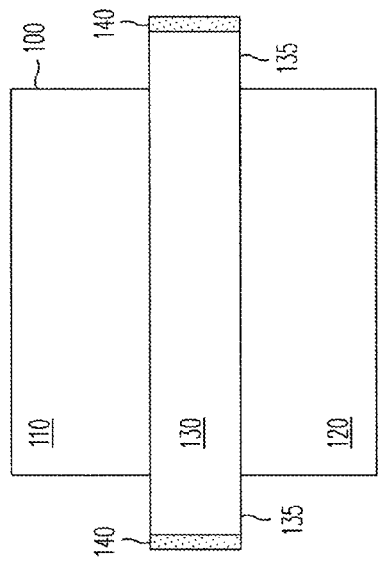

Each of channel region extensions 135 have a width x and a length y (FIG. 1E). Although FIGS. 1B and 1D-1H illustrate channel region extensions 135 having approximately the same dimensions as each other, this need not be the case. Channel region extension length y is typically smaller than the length of polysilicon gate 150, while channel region extension width x can be selected to provide the desired device features. The increased length of the channel edge caused by the extensions, i.e., and increase from y to 2x+y, serves to increase the effective channel length of channel region 130 to a value greater than the case where the channel region terminates "flush" with source and drain regions 110 and 120. By increasing the net channel edge length, channel region extensions 135 lead to significantly reduced OFF state leakage due to the attenuation of parasitic transistor short channel effects.

Figure 1F:
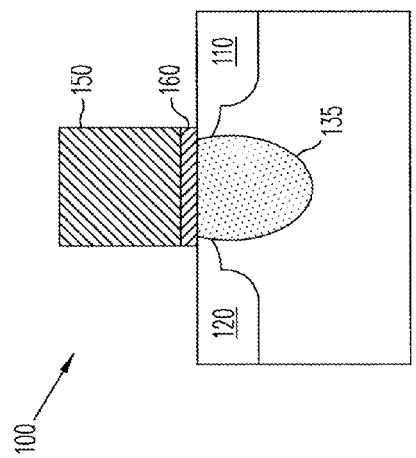
Figure 1G:
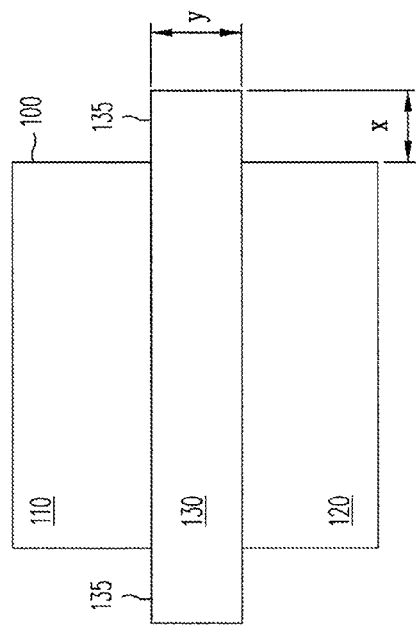
Figure 1H:
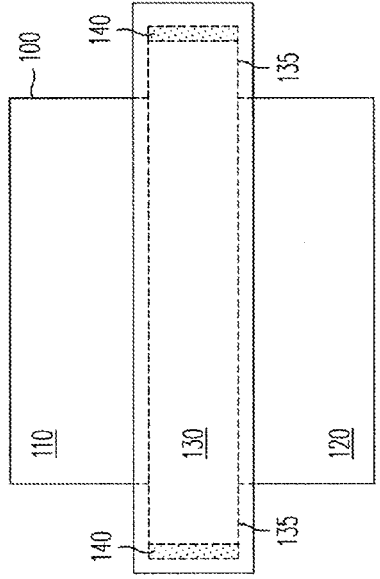

In some implementations, the PID structure effectively increases the local channel length by more than a factor of two. The geometry of the PID provides for selective doping within specific regions 140 as shown in FIGS. 1F-1H. FIGS. 1F and 1G show top views of device 100 including channel extension impurity regions 140, typically formed along the length of channel region extensions 135. Channel extension impurity regions 140 are typically formed to have relatively high impurity concentrations, and are introduced to overlap end portions of the channel region extensions so that the impurity concentration of these end portions is increased relative to the impurity concentration of those portions of the channel region 130 located between source region 110 and drain region 120. For example, where the channel region has a p− impurity concentration, channel extension impurity regions 140 form a pair of p+ channel stops. This relatively high impurity concentration of the channel stop insures that the parasitic sidewall threshold is higher than any negative threshold shift which might be induced by ionizing radiation. These more heavily doped extension impurity regions are typically spaced apart from the end wall edges of source and drain regions 110 and 120 by respective portions of the extension regions of the same doping concentration as channel region 130 itself, so that the more heavily doped channel extension impurity regions do not form p+/n+ junctions with the source and drain regions 110 and 120. Such junctions can have very low breakdown voltages, thereby adversely effecting device performance. The extension width x is generally determined by the choice of doping ion and the manufacturing process's thermal diffusion exposure. For example, a boron doped PID structure would typically have a larger extension width x as compared to an Indium doped PID structure. Thus, extension width will typically be driven by concerns about excess back-diffusion and enhanced doping of the transistor active area. In general, either acceptor or donor impurities can be used to form channel extension impurity regions 140. Variation of impurity type, implant energy, and dose will typically provide different types and/or levels of radiation isolation improvement.

As shown in FIG. 1G, channel region extensions 135 are located below (and hidden by) gate electrode 150, which allows self aligned conventional processing to be used subsequent to PID formation. In the case of n-channel devices, the channel region extensions when combined with impurity doping can be used to prevent unwanted electrical inversion (threshold voltage depletion) of the edges (or sides) of the n-channel transistor silicon channel area. This sensitive region generally extends below the gate electrode between source region 110 and drain region 120, as illustrated in FIG. 1H which shows an end view of the device. Thus, in some embodiments, channel extension impurity regions 140 are formed to extend to a depth greater than the depths of the source and drain regions. The PID can likewise be used in p-channel transistors to prevent threshold voltage enhancement (opposite of n-channel) caused by positive charge accumulation along the active area edge of the PMOS transistor active area. Note that because the PID structure can increase the size of the transistors active area, gate capacitance may also increase. This can lead to reduced speed in operation of the transistor. To compensate for this effect, various embodiments can adjust different aspects of the device geometry. For example, in one embodiment the width of the PMOS can be increased to help reduce the gate capacitance.

Thus, the PID structure reduces or eliminates parasitic field transistor inversion which reduces or eliminates a major source of $I_{off}$ leakage caused by charge build up at the silicon/$SiO_2$ (160) boundary. Moreover, the PID structure doped region provides for local minority carrier lifetime reduction, reduced sensitivity to substrate noise and body voltage effects, and enhances the transistor snap-back voltage. The PID structures described herein can be fabricated in both bulk silicon and silicon films, such as silicon-on-insulator (SOI).

Latch-up generally, and in the case of circuits in radiation environments SEL, is a serious failure mode in CMOS circuits. In the best case, latch-up results in soft failure with a loss of data or logic state. In the worst case, latch-up causes a destructive hard failure with permanent loss of the circuit. Thus, from a circuit reliability perspective, latch-up is to be avoided at all costs. As isolation widths shrink, device structures become even more susceptible to both latch-up failure modes. Prevention of both transient and destructive failures is very important in advanced CMOS IC's since most conventional CMOS technologies have largely converged on the use of p− bulk substrates. As noted above, radiation environments present special problems to CMOS circuits in that high-energy particles deposit significant electrical charge to the bulk substrate. The instantaneous appearance of static charge deposited by a high-energy particle passing through an IC can immediately induce large displacement currents on the picosecond time scale accompanied with rapid potential shifts away from initial logic states. The deposition of energy by the particle typically causes diodes to forward bias, followed by large transient injection currents which reinforce the transient upset and can cause the CMOS circuit to latch-up.

BGR Structures

Figure 2:
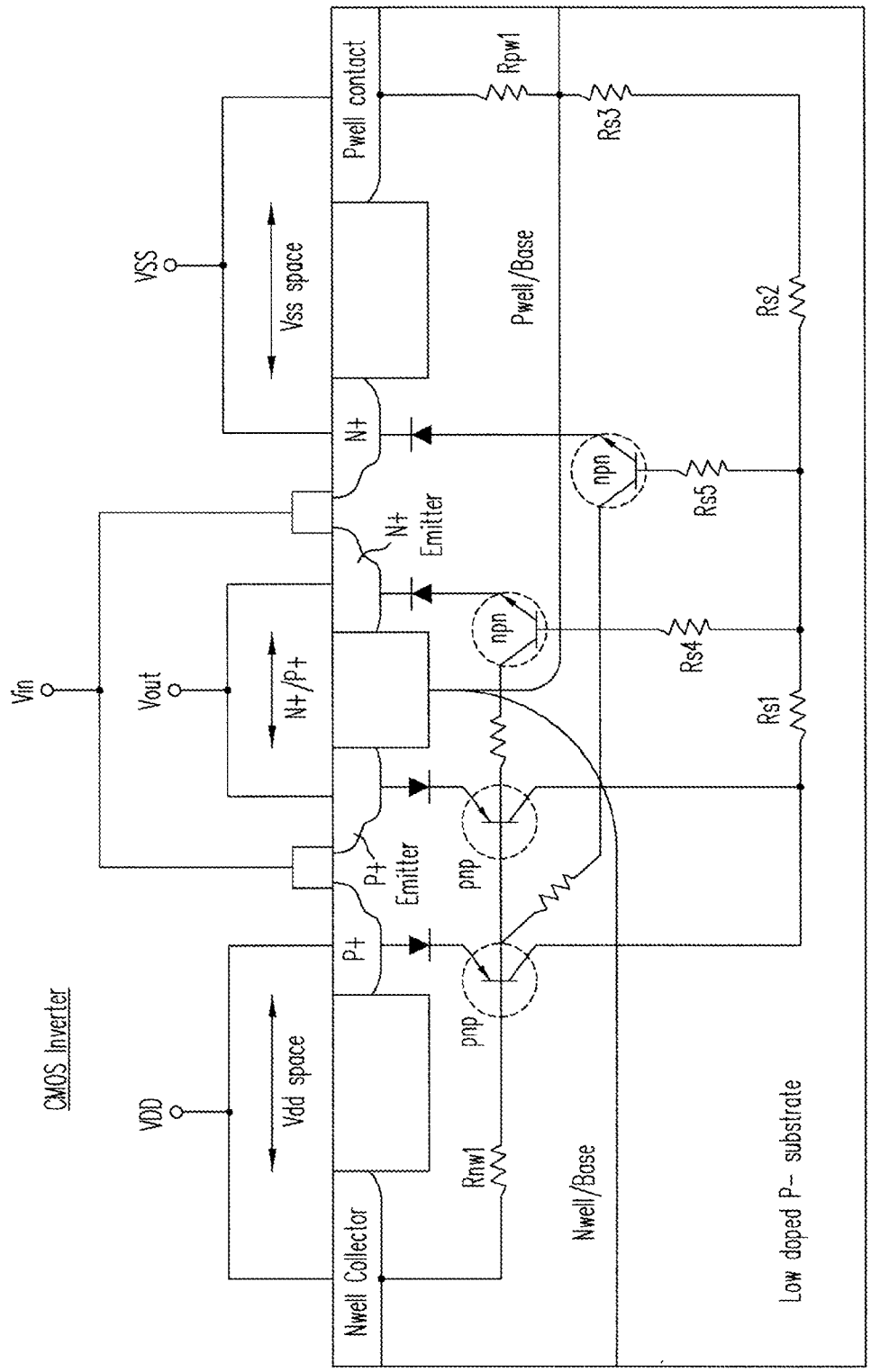
FIG. 2 shows a cross-section diagram of a CMOS inverter formed on a p− substrate.

Latch-up in a conventional CMOS inverter circuit is illustrated in FIG. 2, which shows a cross-section diagram of a CMOS inverter formed on a p− substrate. An equivalent circuit diagram is also shown in FIG. 2 overlaid on the CMOS inverter. In CMOS technology, the basic switching circuit is an inverter formed from a complementary pair of MOS transistors, one NMOS and one PMOS. Electrical isolation is achieved by using both dielectric and pn junction diodes. P-type doped regions (p-wells) isolate NMOS transistors, while n-typed doped regions (n-wells) isolate PMOS transistors. FIG. 2 illustrates the parasitic electrical elements, bipolar transistors, resistors and diodes, that co-exist within the CMOS structure. The source and drain regions of each MOSFET in the inverter form bipolar emitters. In normal operation, the circuit maintains a reverse bias of the diodes formed by the n-well/p-substrate, the p+/n− junction of the PMOS and the n+/p− junction of the NMOS. External factors such as leakage, circuit switching noise, particle upset, and transient overvoltage at the p+ diffusion or undervoltage at the n+ diffusion can trigger one of both of the parasitic bipolar devices into the active state. If either of the emitter or base junctions is forward biased, emitter currents will be sourced to corresponding base/collector regions, immediately shifting the local potential from its initial voltage state.

The network parasitic devices forms a pnpn silicon controlled rectifier (SCR) power device which can be unintentionally biased into a high current, low impedance state, thereby causing latch-up. The circuit elements $R_{S1}$, $R_{S2}$, and $R_{S3}$ are the net effective bulk p− substrate resistors, while $R_{NW1}$ is the n-well series resistance and $R_{PW1}$ is the p-well series resistance. In conventional technology substrate resistors would have resistances on the order of 1 kΩ or greater. In a typical example of CMOS circuit operation, the bulk substrate represents ground potential (0 volts) and is referred to as $V_{SS}$. If current is injected from any source available to the p− substrate, the local potential (within the p− substrate) will increase in magnitude above zero volts as a function of the high value substrate resistance. The n+/p− diffusion diodes located in the p-well, and which were previously undisturbed, would then enter a forward biased conduction as the P-substrate potential increases above approximately 0.3 volts. It is this second contribution by the previously undisturbed n+/p− diffusion diodes which now positively enhances the initial small signal upset event, and can lead to latch-up. Likewise the same event is possible starting with forward biased p+/n− diffusion diodes which are located within the n-well isolation doping region that is caused by either an over voltage of the p+ diffusion or a transient under voltage condition existing within the n-well local potential, which typically equals the circuit supply voltage or terminal voltage ($V_{DD}$, or $V_{cc}$).

Thus, the network of series resistors plays a direct role in the transient bias states of the different impurity doped regions, which then directly influences the bias and conduction state of the diodes. Latch-up can be prevented by keeping the diodes in their reversed bias (off) states. A first step in reducing or preventing latch-up is reducing the effective resistance of p− substrate resistors $R_{S1}$ and $R_{S2}$. The p− substrate resistance can be reduced using a high-dose buried layer (HDBL) 300 as illustrated in FIG. 3.

Figure 3:
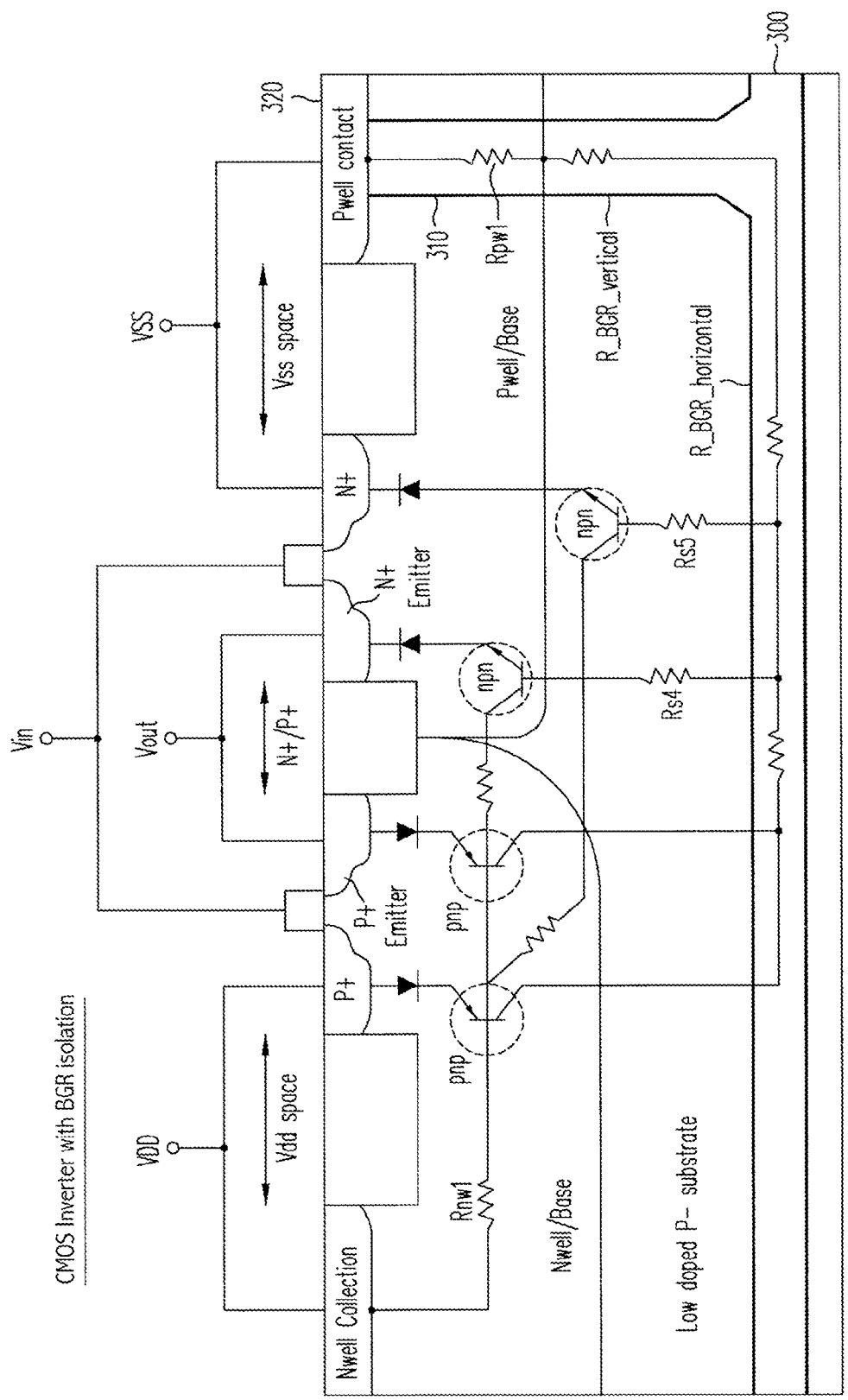
FIG. 3 illustrates a simplified block diagram of an inverter structure utilizing a buried guard ring (BGR) structure.

In the example of FIG. 3, HDBL layer 300 is a heavily doped region of the same conductivity type as the p− substrate, and is placed beneath the active device regions of the device by ion implantation. In general, both the doping and damage characteristics of HDBL influence device performance. HDBL structures are easily integrated into standard CMOS processing with the addition of typical steps such as, an implant step, a rapid thermal anneal (RTA), and an optional cleaning step in between the implant and anneal. The process steps associated with the HDBL can be performed either before or after dielectric isolation ($SiO_2$) formation either by LOCOS or the use of a shallow trench isolation (STI) structure common in many CMOS processes. While a variety of different impurities can be used, the most common implants are boron implanted at 1.0-2.5 MeV (for p-type substrates), and phosphorus at 1.5-3.5 MeV (for n-type substrates). If a wafer-normal to ion implant beam angle of zero degrees is set during ion implantation, the necessary energy to achieve a desired depth of the ion implant can be significantly reduced. Implanted doses typically vary between $1\times10^{13}$ and $5\times10^{15}$ cm$^{-2}$, which forms a highly doped and abrupt layer approximately 1.0-5.0 µm below the silicon surface. The buried layer peak doping concentration can range from $1\times10^{17}$ cm$^{-3}$ to $5\times10^{21}$ cm$^{-3}$. The buried layer is typically implanted sufficiently deep so that the final dopant profile (after all thermal processes) does not counterdope the retrograde well of opposite conductivity, which results in low well-substrate breakdown voltage. For example, a CMOS twin well process includes an HDBL structure (i.e., boron with an implant energy of 1.7 MeV and a dose of $1\times10^{15}$ cm$^{-2}$ forming a blanket p+ buried layer).

For example, in the case of FIG. 3 where the substrate is p− doped, the deep p+ layer provides a low resistance shunt 300 that significantly reduces the series resistance between the pnp subcollector (below the n-well) and the p+ collector ($V_{SS}$). Forming a p+ shunting layer 300 via implantation also gives circuit designers the option of patterning the implant to independently optimize substrate resistivities in different areas, e.g., for a system-on-chip design. Thus, substrate resistors $R_{S1}$ and $R_{S2}$ are now significantly reduced, typically by more than two orders of magnitude, because of the presence of HDBL 300. The spreading resistance of the region can be lowered to less than 50Ω as compared to 2 kΩ or more for conventional CMOS isolation. However, use of the HDBL alone does not affect other parasitic resistances such as $R_{S3}$ and $R_{PW1}$. Consequently, significant vertical resistance continues to exist.

A second step in addressing latch-up and other substrate current transients is to reduce the significant vertical resistance. Addition of a vertical conductor 310 extending between the buried layer 300 and a p-well contact region (as shown) or some other substrate surface terminal significantly reduces this resistance. In one embodiment, the vertical conductor 310 is formed as a vertical impurity region having the same conductivity type as the substrate, but typically having an impurity concentration greater than that of the substrate. For example, where the substrate is a p− substrate, vertical conductor 310 can be formed from one or more p+ implants into the region extending between p-well contact 320 and buried layer 300. High-energy ion-implantation combined with photoresist masking and/or multiple energy implantation can provide a vertical p+ doped region with high aspect ratio doping profile to bridge the uplink path from an ohmic $V_{SS}$ surface contact or Schottky diode to buried layer 300 or other p+ bulk layers as is typical for p− epi on p+ bulk substrates. For example, in one implementation vertical conductor 310 is formed by multiple ion implant steps at one or more energy levels.

When buried layer 300 and vertical conductor 310 are used in conjunction with each other, a new structure referred to as a buried guard ring (BGR) is formed. The BGR offers several isolation attributes. Since the low resistance deep buried layer is now locally connected via a vertical doping region or other conductor: (1) minimum impedance is provided for most or all of the accumulated, deposited or injected charge occurring within the silicon substrate region; (2) transient times for charge termination are reduced thereby improving overall isolation by reducing or minimizing the duration of any n+/p− diode forward biasing which reduces injected currents; (3) the BGR forms a low-resistance circuit leg back to the p-well contact terminal, thereby creating a current divider which effectively shunts and sinks a majority of any injected or deposited current away from the $R_{S4}$ and $R_{S5}$ resistor legs, thereby significantly reducing base current feedback to the parasitic npn devices shown and limiting voltage transients for the p-bulk silicon region associated with the CMOS structure. The BGR structure, by effectively shunting injected current or stray charge promptly to the $V_{SS}$ terminal, reduces or prevents voltage transients which could subsequently forward bias either or both of the n−/p− diodes (n-well/p-substrate diode inherent in CMOS twin well isolation) and the n+/p− diodes (inherent in NMOS transistor) and eliminates subsequent triggering of the pnpn SCR network. Latch-up with the BGR isolation structure present then becomes difficult or impossible to initiate, thereby preserving the circuit from ever entering destructive latch-up.

Additional details of example PID and BGR structures, and additional embodiments of BGR structures, are described in U.S. Pat. No. 7,304,354 to Morris, the disclosure of which is incorporated herein by reference in its entirety. Summarizing the above very briefly, the BGR includes a High-Dose Buried Layer (HDBL, or sometimes described as a Horizontal BGR, HBGR) and a Vertical high-dose part (VBGR) which extends from a contact at the silicon surface to the HBGR. Both the HBGR and VBGR may be high dose boron implants. In some embodiments the contact to the HDBL is to the back side of the chip, and the VBGR is not necessary, as is described in U.S Publication 2007-0141794 published on Jun. 21, 2007 (and now issued as U.S. Pat. No. 8,278,719 to Morris), the disclosure of which is incorporated herein by reference in its entirety.

During a heavy ion strike, a track of charge (electrons and holes) is generated along the path of the ion. The flow of this charge toward the contacts creates currents which then change voltages in the silicon. These voltage differences can cause the junctions to be thrown into forward bias which then generate more current. The combined result of the initial current from the strike and the subsequent current from the forward-biasing of the junctions can flip a bit in a memory cell, latch or flip-flop. (Or even more destructively, it can cause latch-up.)

By reducing the resistance throughout the P-well to the contact, the BGR keeps the P-well region very close to the intended ground, or VCC, potential. In general, this also greatly reduces the severity of the secondary currents, with the result that the overall duration of the generated currents is greatly reduced. Without a BGR, this transient duration is typically 1ns; with BGR, this is typically reduced by a factor of three to about 0.3 ns.

In addition, without BGR, the hole charge from a strike tends to linger and wander through the P-well with a range that can extend 10 um or more from the strike, with no hard cutoff. Thus, multiple devices within this radius can be affected by a single strike. With a BGR, the hole charge is collected by the HBGR, and is conveyed directly to the contact without further effect on the P-well voltage. Since the HBGR is only 1-2 microns below the surface, the holes can only wander for approximately this same distance before hitting the BGR. The spatial extent of a particle strike is thus limited to about a 1-2 micron radius from the initial strike. The BGR thus greatly reduces both the temporal and spatial extent of parasitic currents from a strike.

BGR structures have been shown to significantly suppress and reduce the parasitic charge sharing effect between CMOS diffusion junctions within a dense CMOS circuit fabric. The suppression of charge sharing by the parasitic elements acts to eliminate the parasitic network which supports a micro-latch up event and which is present in all CMOS silicon junction isolated technology that is used to manufacture CMOS integrated circuits. Having a BGR structure present in the silicon device results in a significant beneficial effect as the parasitic charge sharing which originates from the source of the first electrical upset (the single event particle passing through a single diffusion junction) is reduced to a smaller physical region within the dense circuit fabric. The suppression of charge sharing helps avoid secondary upset of a neighboring electrical cell which was not struck by the originating single particle.

Thus the reduction of the sensitive volume by the BGR structure in response to an SEU event helps eliminate the occurrence of either a range of Single Event Effects (SEE) such as a Multi-Bit Upset (MBU) event, a Single-Event Functional Interrupt (SEFI) event, a Single-Event Micro Latch-up (SEML) event, a Single-Event Latch-up (SEL) event, or a Single-Event Transient (SET) event. In any of the possible events that can occur in a CMOS circuit when struck by a radiation particle (SEU, MBU, SEFI, SET or SEL), any such occurrence by any of these effects would cause functional errors for the cell that is directly struck as well as the other cell interactions which can spread to nearby cells away from the location of the original SEU strike. Such events act to temporarily interrupt the CMOS circuit or the data it is processing from operating properly and exhibiting error-free electrical behavior for a period of time. In certain cases such events can permanently damage the CMOS circuit.

Circuit Redundant Methods

Another general approach for providing immunity from SEE's is to add redundancy to the circuit design. Versions of memory cells, latches and flip-flops have been used which incorporate additional numbers of transistors (relative to more basic versions), that are not upset by a strike which affects only a single node within this cell. One such spatially-redundant design is called "DICE" (for Dual Interlocked Storage Cell) which is described by T. Calin, et al., in "Upset Hardened Memory Design for Submicron CMOS Technology," IEEE Trans. On Nuclear Science, Vol. 43, No. 6, December 1996. To write to such a DICE cell, the input voltage has to be changed at two nodes. If only one node is changed, the DICE cell will not change its state. Thus this cell provides redundancy and protects against stray charge from a strike affecting only one of these nodes.

As used herein, DICE cells are storage cells which use spatial redundancy as a means to avoid cell upset (digital bit state flip 0->1, or 1->0), of which many different circuit forms are possible. However, DICE Cells which are manufactured with a commercial CMOS process may fail when: (1) exposed to more energetic levels of radiation; or (2) the DICE cell is shrunk to smaller feature sizes.

Generally (i.e., for low radiation environments such as terrestrial space environments at sea levels), in order for an upset to occur, two circuit nodes have to be hit simultaneously by the SEU particle. There are basically only two mechanisms by which a sensitive node pair can be upset by a single strike.

The first mechanism that can cause a DICE cell to fail is when the SEU particle strikes the silicon device regions and both sensitive regions of the sensitive node pair are affected either immediately or after a short time via the charge sharing mechanism. The charge sharing mechanism is the origination of and spreading of parasitic bipolar currents that originate from the initial SEU strike into the first silicon region (or node) and then spread to a neighboring node which was an unstruck silicon node or region. The effect of this parasitic current then acts to upset the unstruck node even though it was never struck by a SEU particle. Hence in this fashion a DICE cell can be upset by one particle striking at certain regions inside the DICE cell.

A second mechanism that can cause a DICE cell to upset is a more rare SEU strike that strikes at a grazing angle such that the striking ion directly hits the first sensitive region and then the same particle trajectory hits a second sensitive region. In this fashion a single SEU particle can strike both sensitive regions (within the boundary of the single DICE cell) of a sensitive node pair.

Increased spatial separation of the sensitive DICE cell node pairs can reduce both of the aforementioned mechanisms, thus giving DICE'd storage units (such as flip flops using 2 DICE cells instead of 2 inverters) a big advantage to resist an SEU upset when compared to the conventional standard cell alternative versions such as a cross-coupled inverter pair. However, the spatial separation has the disadvantage of the making the DICE cell too large and more difficult to use in more advanced CMOS circuits which desire small circuit size.

Triple Module Redundancy (TMR) works by taking sensitive parts of a circuit (such as a logic block) and placing them in the schematic three times in parallel. The three outputs of the logic blocks are then input into a voting circuit which chooses the majority. In order for a strike to cause an error, it would have to affect two out of the three logic blocks. TMR and DICE are two popular ways to add spatial redundancy to a circuit. Other spatially redundant techniques include the HIT cell, the Seuss cell, and the TRed cell, which are known in the art. (See "SEU Tolerance of Different Register Architectures in a 0.25 um CMOS Process" by Hoff, et al., presented at the Fifth International Meeting on Frontend Electronics, Snowmass, Colorado, June 2003.)

Nevertheless, it has been recognized that these spatially redundant methods do not work as well as they should because the spatial extent of some heavy-ion strikes is sometimes greater than the spatial separation of the redundant parts—thus allowing a single strike to affect two or more sensitive nodes within the cell. Additionally, strikes can also affect the clock inputs to a latch or flip-flop.

Another way of preventing the errors from strikes affecting multiple nodes, and of preventing errors caused by strikes in the clock lines, is to prevent any writes from occurring until the inputs have persisted for a set duration designed to be longer than most transient current durations from strikes. In a DICE flip-flop (DFF), a delay of typically 1ns is placed on one of the two inputs. A write will not occur until both inputs are in agreement which is at the end of this designed-in delay. Similarly, there are two clock inputs to a DFF with a delay on one of these. If the effect of a strike persists for a time less than the designed-in delay, then it will not affect the DICE cell. So "temporal filtering" may be added to the spatial redundancy by requiring an applied change to exist for some designed finite duration before it can write to the cell. This finite duration is simply a delay added to one of the inputs to the cell. A disadvantage of this approach is that this designed-in delay also slows down normal operation of the circuit (by the built-in delay). This same approach of designing a delay can be combined with TMR or any other construction with multiple inputs. For TMR with temporal filtering, the delays typically are 0, dt, and 2*dt added to each of the three otherwise identical logic blocks, where dt is the designed-in delay.

Pure temporal redundancy without spatial redundancy may be achieved by sending the inputs through a single logic block multiple (e.g., three) times with a majority vote after all three passes are finished.

Combination of BGR Technology with Spatial Redundancy

Because BGR reduces the temporal extent of most strikes, by typically a factor of three, temporal filtering can be designed to be more effective and/or with smaller built-in delays which slow down normal circuit operation. Because BGR reduces the spatial extent of strikes to within a few microns, spatial redundant methods need only separate sensitive combinations of nodes by this distance. This greatly simplifies layout which would otherwise be impractical for many or most circuits. Aside from the advantage gained by BGR alone, the BGR therefore improves the effectiveness of both temporal and spatial redundant methods. For example, BGR and DICE alone each reduce SRAM upsets by about a factor of ten, but together we are expecting reductions in SEE's by more than a factor of 1000.

Adding the BGR taps within the boundary of a DICE cell layout will significantly reduce charge sharing and the resulting node upsets for all of the aforementioned SEU, MBU, SEFI, SEL mechanisms.

Figure 9:
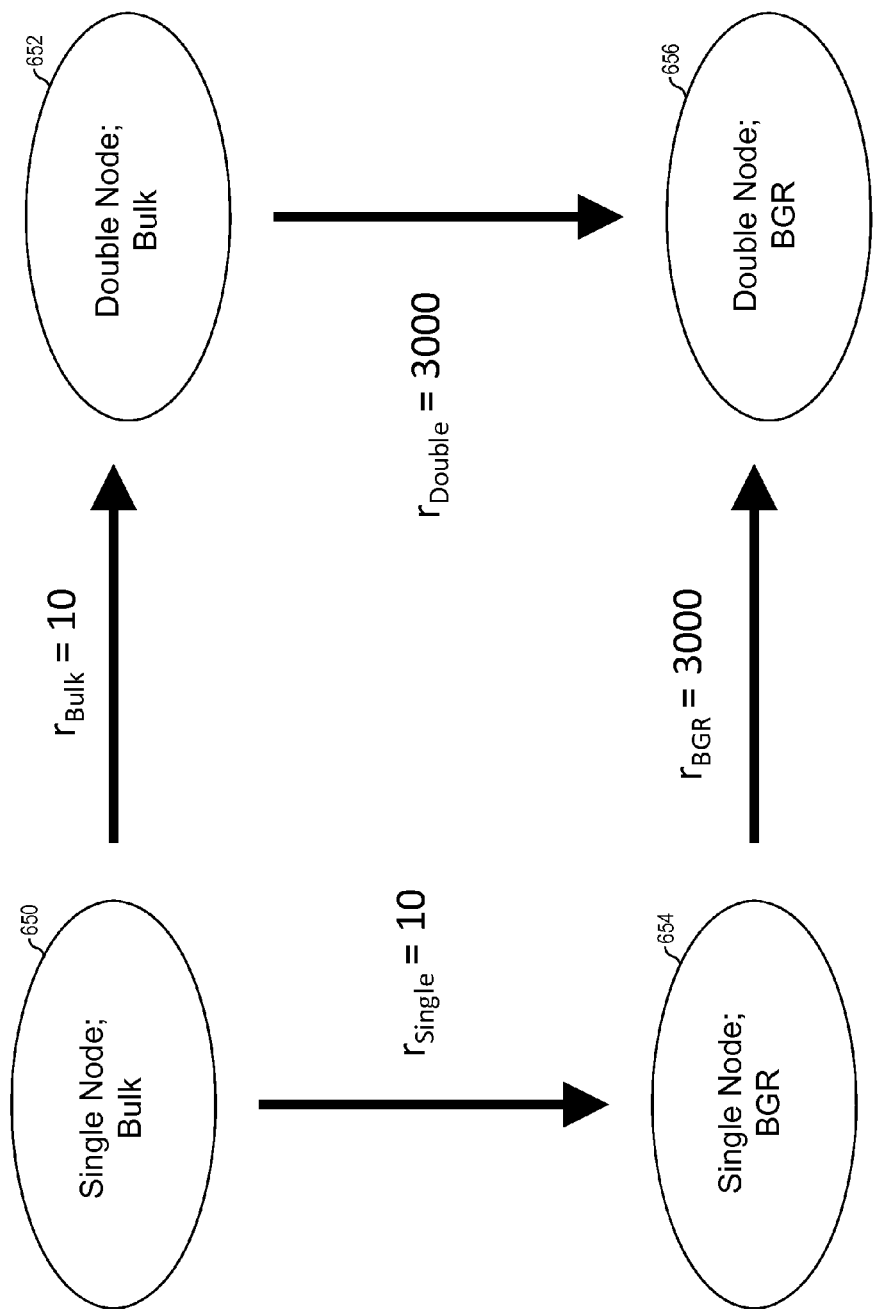
FIG. 9 is a diagram depicting improvements achievable by combining spatial redundancy and BGR techniques.

Mechanism 1 (charge sharing) is significantly reduced or eliminated because the BGR structure reduces the size of each of the sensitive regions by elimination of the parasitic charge sharing. FIG. 9 diagrammatically depicts the performance improvement of adding spatial redundancy (labeled 652), adding BGR (labeled 654), and adding both spatial redundancy and BGR (labeled 656) to a bulk CMOS process (labeled 650). The low resistance shunt of the BGR controls the local substrate potential which minimizes forward biasing of the n/p diodes, which keeps the diodes in a current blocking state such that little or no electron parasitic emitter current is injected during the SEU upset transient period. Also, the BGR doping reduces the minority carrier lifetime (electrons in p-type) which reduced the magnitude of free electrons which can be collected by any positively charged anode junction or diffusion region, thus leaving the node undisturbed.

Adding the BGR doping regions to a DICE cell, which acts to minimize charge sharing, prevents overlap of the sensitive regions. This makes it much easier to prevent one node from interacting or negatively affecting the other, and thus makes the DICE cell significantly more SEU particle upset resistant.

Mechanism 2 is reduced by the same effect by reducing the cross-section for the strike hitting either of the nodes of a sensitive pair. In fact, since two nodes must be upset, the reduction in cross-section for hitting one node should be squared in any calculation requiring two nodes for upset. For example, if BGR reduces the cross-section for upsetting one node by a factor of two, the corresponding reduction in DICE cell upset is a factor of four. Some data suggest that BGR cross-section reduction is actually greater for grazing angle strikes (the only angles that can directly hit both nodes of a sensitive node pair).

Example DICE Cells

In an example SRAM embodiment, both BGR techniques and DICE cells are implemented. Versions of the DICE structure can be used to replace memory cells, flip-flops, and latches, but they generally require twice the number of transistors compared to the standard, non-radiation-hard versions. This is more area-efficient than triple-modular redundancy (TMR), which takes about three times the area and also requires an additional voting stage. In standard usage, the DICE cell generally provides improved SEE performance. However, L. W. Massengill et al., in "Single Event Mechanisms Impacting Sub-100 nm Radiation-Hardened Design," (presented at GOMAC Conference, March 2007) and others have shown that most DICE parts still fail above a LET threshold around 30 to 40 MeV/(mg/cm2) including some with thresholds less than 5 MeV/(mg/cm2). The problem with standard DICE is related to the parasitic bipolar transistors that get turned on during a SEE event. The induced currents can often travel ten microns, upsetting multiple devices within this range. The redundancy of the DICE cell breaks down when two of the four nodes (either both even nodes or both odd nodes) are affected, and it is extremely difficult to place the sensitive node pairs far enough apart without sacrificing the ability to do a practical layout. This is especially true since there is no hard cut-off distance for multiple node upsets.

In contrast, we have demonstrated that there is such a hard cut-off when a BGR is present. In heavy-ion testing up to 108 MeV/(mg/cm2), less than ten MBU's were observed with a length beyond either two rows or two columns. Based on the bit cell geometry and pitch, this places a maximum upper bound of between 1um and 2um for the spatial extent of multiple-bit upsets (MBU's)—or of affected nodes in a DICE cell. (There was no minimum distance determined in this experiment because there were sensitive regions where four cells met at the corners.) Device simulation is in agreement with this result, and in fact supports the intuitive notion that the spatial extent of MBU's is about the same as the depth of the BGR: about one um. Therefore DICE cells in which the two odd and the two even nodes are spaced by about 2um or more—and which are fabricated in a process that includes the BGR module—should be orders-of-magnitude less sensitive that the equivalent part in a process without the BGR.

Figure 4:
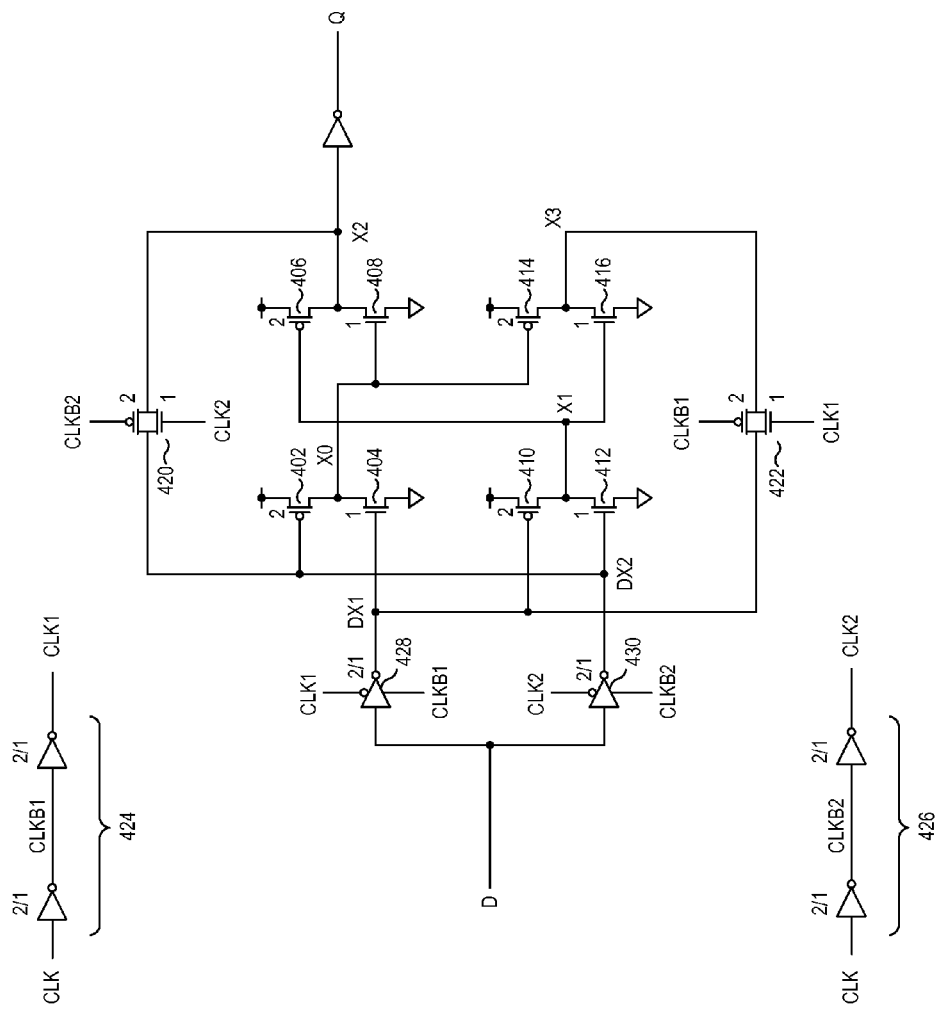
FIG. 4 is a schematic diagram of an example DICE-style latch.
Figure 5:
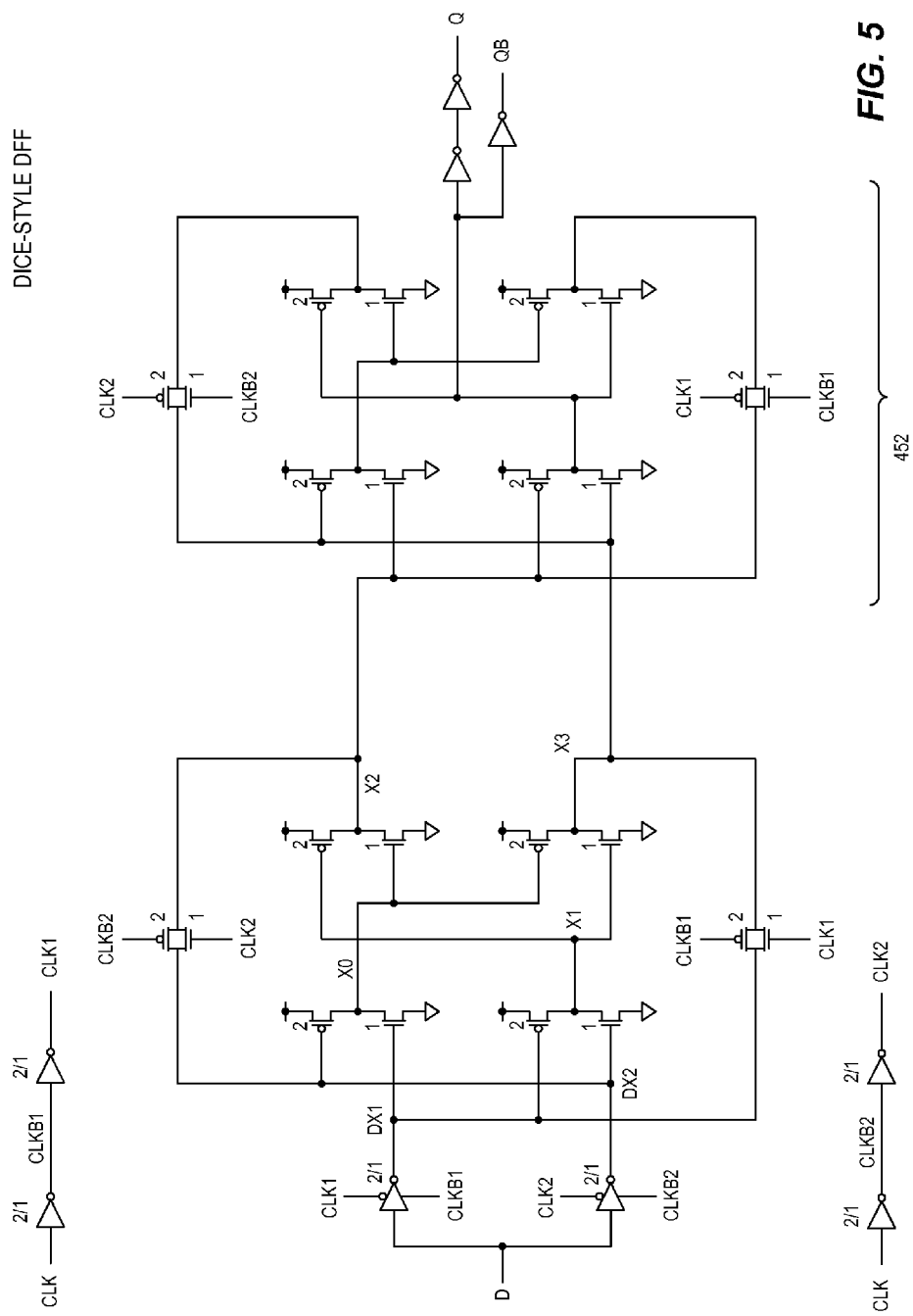
FIG. 5 is a schematic diagram of an example DICE-style DFF.
Figure 6:
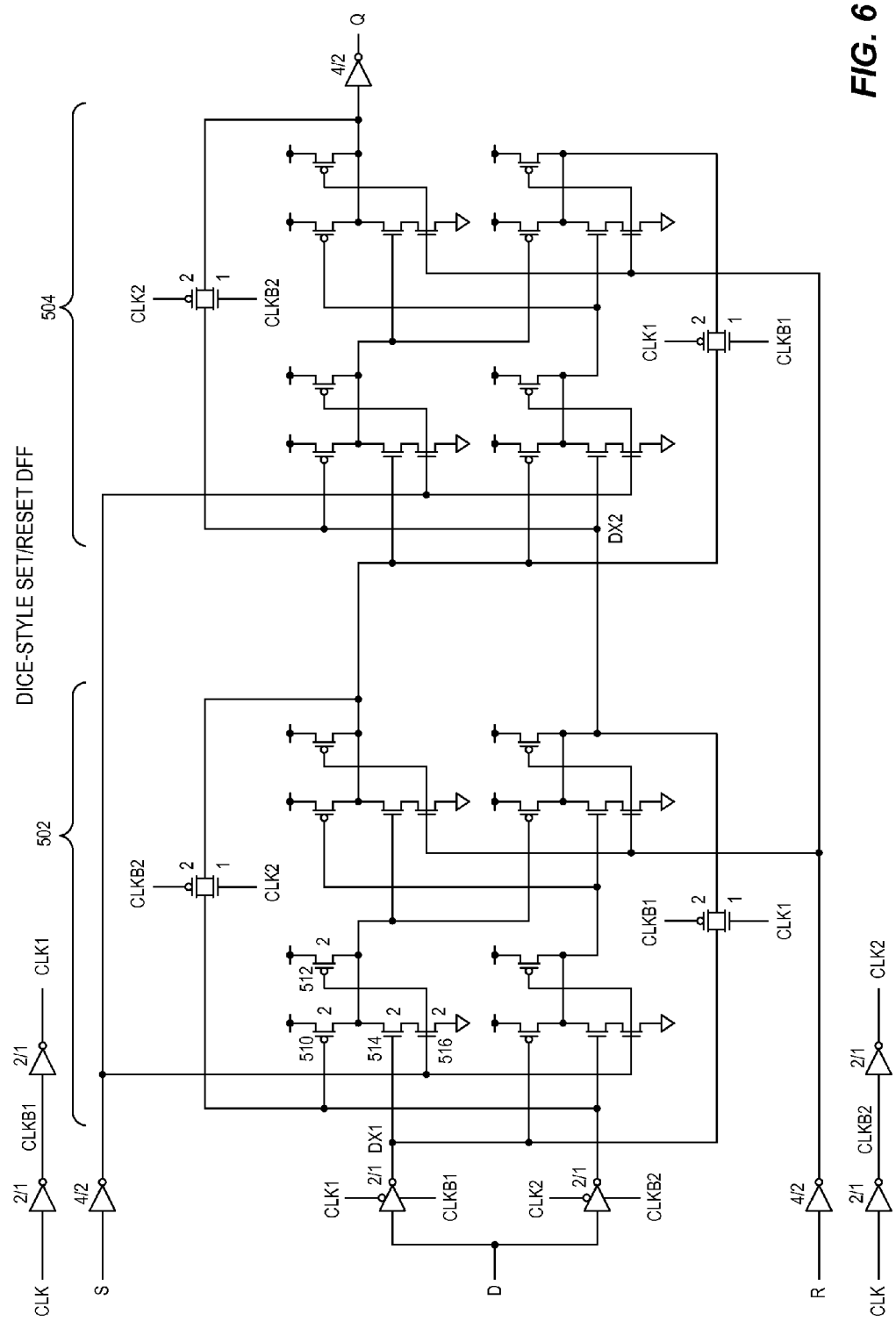
FIG. 6 is a schematic diagram of an example DICE-style Set/Reset DFF.

FIGS. 4, 5, and 6 show schematics of an example DICE-style latch, an example DICE-style DFF, and an example DICE-style set/reset DFF. In each of these schematics, the width of the PMOS transistor, $W_p$, and the width of the NMOS transistor, $W_N$, are indicated next to each transistor (in microns), and the PMOS and NMOS transistor sizes for inverters and buffers is indicated as $W_P/W_N$ next to such device.

Referring now to FIG. 4, PMOS transistors 402, 406, 410, 414, and NMOS transistors 404, 408, 412, 416 form a spatially redundant circuit that samples two versions DX1, DX2 of the input signal D when transfer circuits 428, 430 are enabled, and latches the sampled data state when transfer gates 422, 422 are enabled. Two sets of CLK phases CLK1, CLKB1, CLK2, CLKB2 are used to preserve redundant-node operation if one of the clock phases is disturbed during a SEE event.

Referring now to FIG. 5, a D-flip-flop (DFF) may be implemented by including two latch circuits, here shown as a second latch circuit 452 connected to the first latch circuit shown in FIG. 4. The second latch circuit 452 is clocked out of phase with the first latch circuit. In this example circuit, a true output Q and a complementary output QB are both provided.

Referring now to FIG. 6, an example DFF is shown which includes set and reset inputs. This may be accomplished by replacing each of the pull-up/pull-down transistor pairs (e.g., 402/404) shown in FIG. 4 with a pair of PMOS pull-up transistors 510, 512 and a pair of NMOS pull-down transistors 514, 516. This ensures that each of the set and reset inputs must change the state of two internal nodes in each latch circuit in order to result in a state change. Two such latch circuits 502, 504 are coupled together and clocked out-of-phase to form the master-slave set/reset DFF.

FIGS. 7A, 7B, and 7C together show an example layout of a core portion of a DICE-style latch cell. This core portion includes 4 sets of transistor pairs, corresponding to PMOS transistors 402, 406, 410, 414, and NMOS transistors 404, 408, 412, 416 (but transfer gates as depicted in FIG. 4 are not shown in FIG. 7A). Such a layout is useful in both a DICE-style latch (e.g., as shown in FIG. 4) and a DICE-style DFF (e.g., as shown in FIG. 5). Note that FIG. 7A depicts all layers of the example layout, and particularly highlights the metal 2 layer and its contacts (e.g., labeled 586) to the underlying metal 1 layer. Alignment markers 550, 552 may be used to for alignment assistance when overlaying these FIGS. 7A, 7B, and 7C.

FIG. 7B depicts the same layout in which the metal 2 layer and metal 2-to-metal 1 contacts have been removed to more clearly depict the underlying layers, and particularly highlights the metal 1 layer and its contacts to the underlying polysilicon and active area layers.

FIG. 7C depicts the same layout in which the metal 2 layer, the metal 2-to-metal 1 contacts, and the metal 1 layer have all been removed to more clearly depict the underlying active area, gate layer, n-wells, etc. A PMOS transistor includes active area 576 and polysilicon gate 580, and is disposed within an n-well 562. Metal 1 contact 578 provides for connection from the active area 576 to the metal 1 layer, and metal 1 contact 582 provides for connection from the polysilicon gate 580 to the metal 1 layer. To the left of this PMOS transistor is shown an NMOS transistor that includes active area 568 and polysilicon gate 573. Metal 1 contact 569 provides for connection from the n-type active area 568 to the metal 1 layer, and metal 1 contact 575 provides for connection from the polysilicon gate 573 to the metal 1 layer.

Each of the four NMOS transistors (respectively shown in sections 554, 556, 558, 560) also includes a PID structure. The rectangular feature labeled 572 (shown cross-hatched), although drawn separately, may be merged with the n-type active area 568 to form channel extension regions, as described above in regards to FIG. 1A-1H. Implant mask features 574 may be used to form channel extension impurity regions, also as described above. Generally, node N1 is generated by the PMOS and NMOS transistor pair in section 554, node N2 is generated by the PMOS and NMOS transistor pair in section 556, node N3 is generated by the PMOS and NMOS transistor pair in section 558, and node N4 is generated by the PMOS and NMOS transistor pair in section 560.

Note that the devices associated with the two even (or odd) nodes are separated by the devices associated with the odd (even) nodes. For example, the devices associated with nodes N2 and N4 are separated by the devices associated with node N3. Additional separation was achieved by placing P-well contacts (P-well tap 588, active area 570, and metal contact 571) and N-well contacts (P-well tap 592, active area 590, and metal contact 584) in the center of the structure which effectively decouples (both physically and electrically) nodes N1 and N2 in the silicon from nodes N3 and N4. In some embodiments of this layout, the minimum physical separation between sensitive regions associated with either 2 odd or 2 even-node regions in the silicon is 3um. This should be about twice the necessary distance needed to decouple these nodes when a BGR is present (but much less than half of that needed for bulk silicon). The vertical conductive region for a BGR structure (i.e., VBGR) may be implemented in the well-tap area, or external to the latch cell.

Figure 8A:
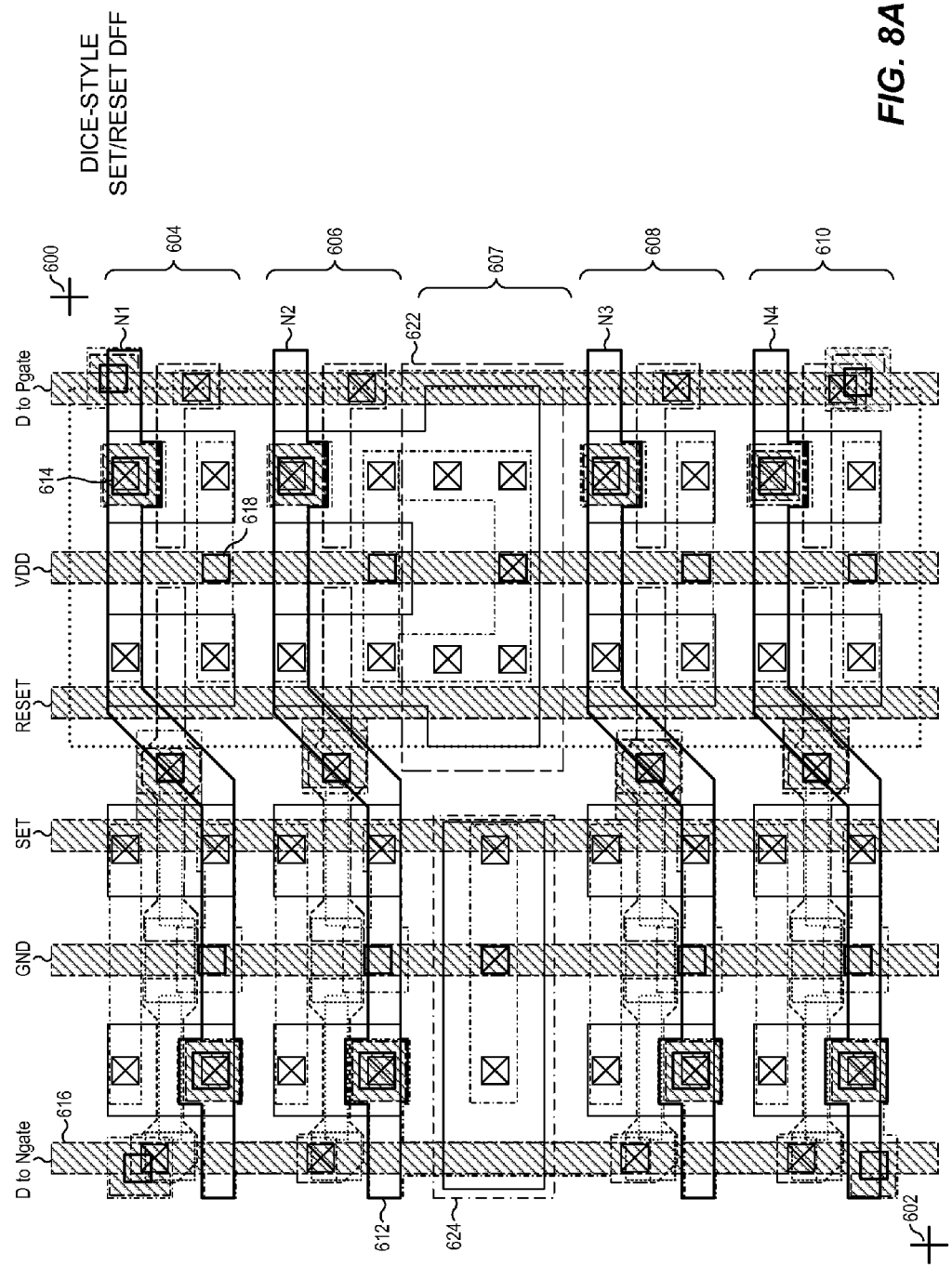
FIGS. 8A, 8B, and 8C together show an example layout of a core portion of a DICE-style set/reset DFF.
Figure 8B:
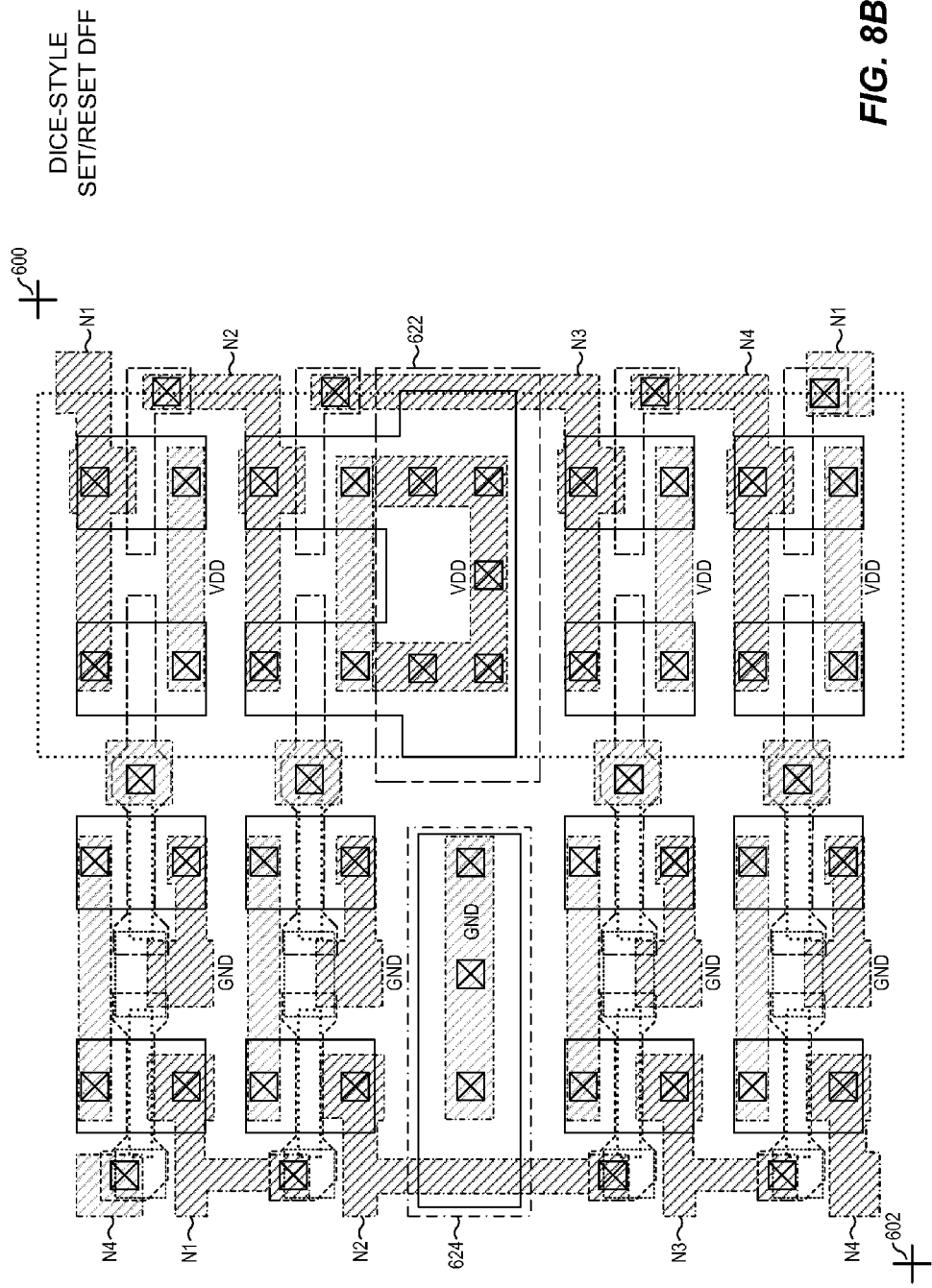
Figure 8C:
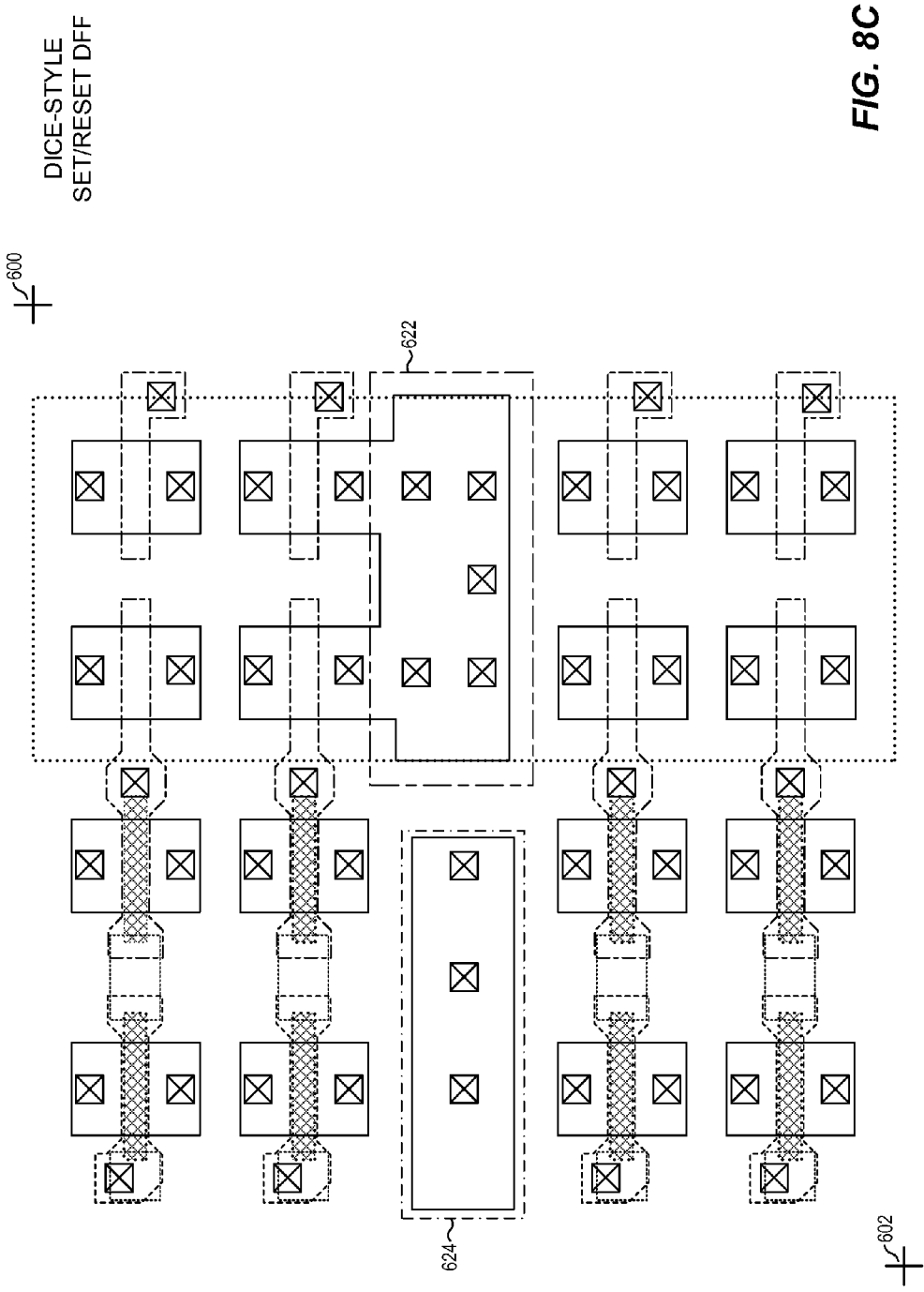

FIGS. 8A, 8B, and 8C together show an example layout of a core portion of a DICE-style set/reset DFF (e.g., as shown in FIG. 6). This core portion includes 4 sets of transistor quads, such as transistor quad 510, 512, 514, 516 (but transfer gates as depicted in FIG. 6 are not shown in FIG. 8A).

Note that FIG. 8A depicts all layers of the example layout, and particularly highlights a metal 3 layer (e.g., labeled 612) and its metal 3-to-metal 2 contacts (e.g., labeled 614) to the underlying metal 2 layer, and also highlights the metal 2 layer (e.g., labeled 616) and its contacts (e.g., labeled 618) to the underlying metal 1 layer. Alignment markers 600, 602 may be used to for alignment assistance when overlaying these FIGS. 8A, 8B, and 8C.

Each of the four sets of transistor quads are respectively shown in sections 604, 606, 608, 610. Generally, node N1 is generated in section 604, node N2 is generated in section 606, node N3 is generated in section 608, and node N4 is generated in section 610. The p-well tap 624 and n-well tap 622 are provided in section 607, similarly to that described above, to provide additional separation between odd (or even) nodes.

FIG. 8B depicts the same layout in which the metal 3 layer, metal 3-to-metal 2 contacts, metal 2 layer, and metal 2-to-metal 1 contacts have been removed to more clearly depict the underlying layers, and particularly highlights the metal 1 layer and its contacts to the underlying polysilicon and active area layers.

FIG. 8C depicts the same layout in which all metal layers and upper contact layers have been removed to more clearly depict the underlying active areas, gate layers, n-wells, etc. Since these features are drawn using the same line and fill codes, and are common to those described above in regards to FIGS. 7A, 7B, 7C, such description will not be repeated here.

As used herein, a "spatially redundant" circuit, such as a logic block, latch, flip-flop or memory cell, is a circuit that contains additional transistors than typical in order to provide protection against upset from radiation (or a particle strike). A common feature is that these cells should be much less sensitive to localized particle strikes. Most cells with spatial redundancy also have (at least) two inputs—for which both must be changed to change the state of the cell. Examples of this are: the DICE versions of the latch, flip-flop and memory cell; the HIT cell, Seuss cells, and TRed cells. TMR is an example of a logic block with spatial redundancy.

As used herein, "temporal filtering" is a method for distinguishing an intended result from a result that is altered by a particle strike. In the methods and structures described herein, temporal filtering is achieved by adding a delay to at least one of the multiple inputs to a spatially redundant part of the circuit.

Memory EDAC and Scrub

The use of Error Detection and Correction (EDAC) techniques is well known in both memory system design and memory integrated circuit design. Historically this has been accomplished by storing/transmitting additional information about a data set in addition to the data itself. This additional information, when combined with the data, can be used to determine if a portion of the data has been corrupted. For example, adding an additional 7 bits of information to a 32 data bit group allows the EDAC engine to: (1) correct one bad bit in any of the 39 (32+7) bits in the group; and (2) detect the occurrence of two bad bits anywhere within the 39-bit group.

An EDAC engine may be viewed as the circuit/system/program that performs the EDAC function. Typically, when a memory access is requested, EDAC is performed as data is output/transmitted from a memory device or module to ensure uncorrupted data is received, and to re-write the original data storage location to correct any underlying corruption in that original location. Separate "Scrub" operations may be employed to periodically access all locations in a memory to correct a single bit error that may have developed in the original data storage location.

The performance of a memory device may be improved by breaking up large groups of data bits into smaller sub-groups, and utilizing multiple EDAC circuits (one per sub-group) to perform EDAC on each sub-group. This has several significant advantages, described in reference to FIG. 10.

Figure 16:
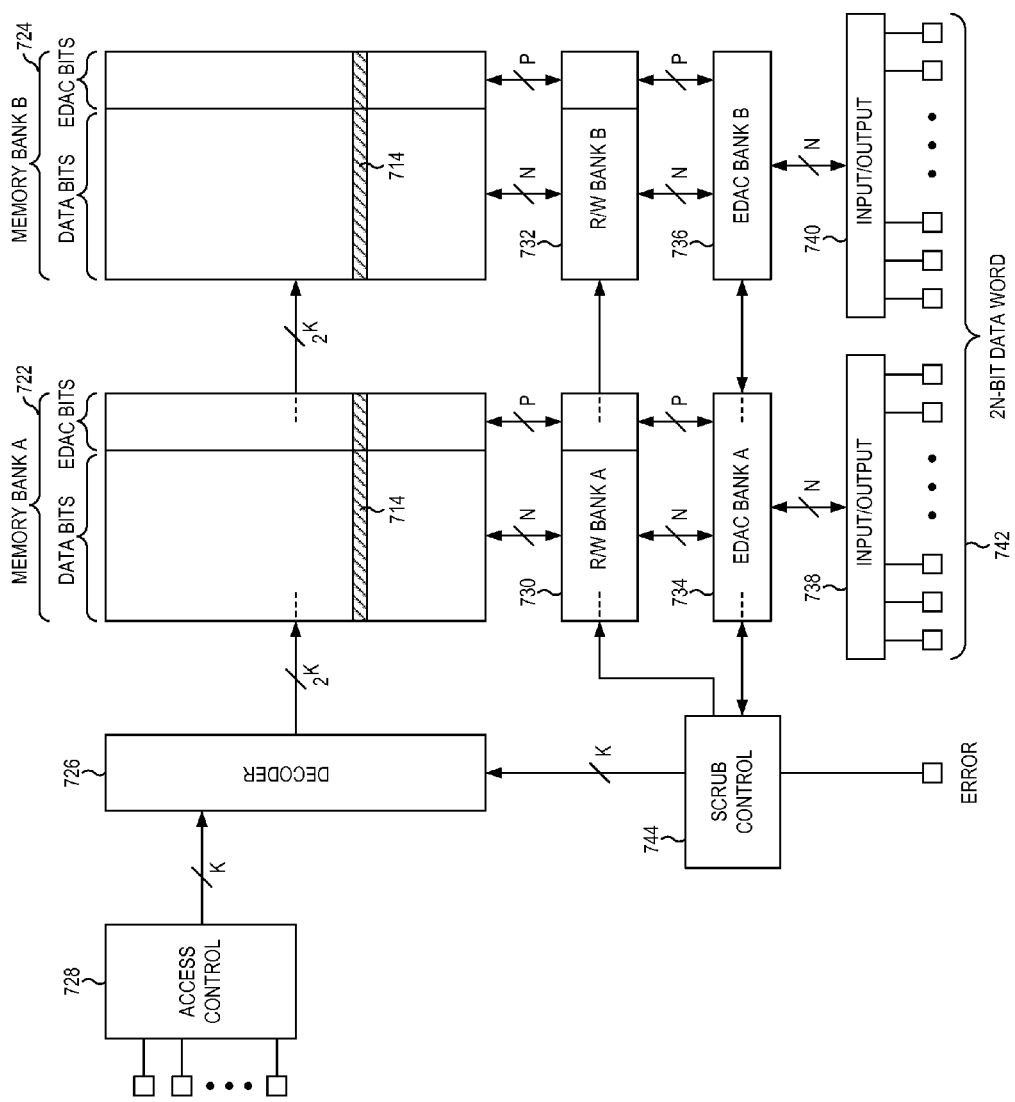
FIG. 16 is a block diagram depicting an embodiment of a memory circuit having two EDAC circuits and one scrub control circuit.

First, such a memory device is better able to withstand (under certain circumstances) multiple bit errors within a large data bit group without incurring the time penalty normally associated with multiple bit error correction schemes. For example, by breaking up a 32-bit data group (labeled 660) into two 16-bit data sub-groups(labeled 662), and adding an appropriate number of EDAC bits (e.g., 6 EDAC bits per each 16 data bit sub-group 662), up to 2 different bit errors can be corrected within the 32-bit group (i.e., one bit error in each 16-bit data sub-group 662). Clearly, other sub-group data bit sizes (e.g., 4, 8, 16, 32, 64, . . . bits) are also contemplated. FIG. 16 depicts an example circuit incorporating such concepts. Even though FIG. 16 is shown as incorporating two memory banks, a physical implementation of such a circuit need not necessitate two identifiably separate memory array blocks.

Secondly, breaking a large data group into sub-groups and providing an EDAC circuit (i.e., engine) for each sub-group allows greater flexibility in what data group sizes can be supported by such a memory device. For example, providing two EDAC circuits and breaking up a 32 data bit group into two 16 bit sub-groups (with corresponding EDAC bits per sub-group) allows the chip to more easily support operation with 32-bit data word widths 666 (with up to 2 bit error correction and up to 4 bit error detection per 32-bit word), as well as operation with 16-bit data groups 664 (with 1 bit error correction and 2 bit error detection per 16-bit word). In addition, even wider data bit groups 668 (i.e., multiples of the sub-group size) with EDAC would also be more easily supported (e.g., 48-bit operation, 64-bit operation, 80-bit operation, 96-bit operation, 128-bit operation, etc.). Such sub-groups may be implemented as separate memory banks, memory array blocks, or memory arrays, or may be implemented using a single such memory bank, memory array block, or memory array.

Figure 11:
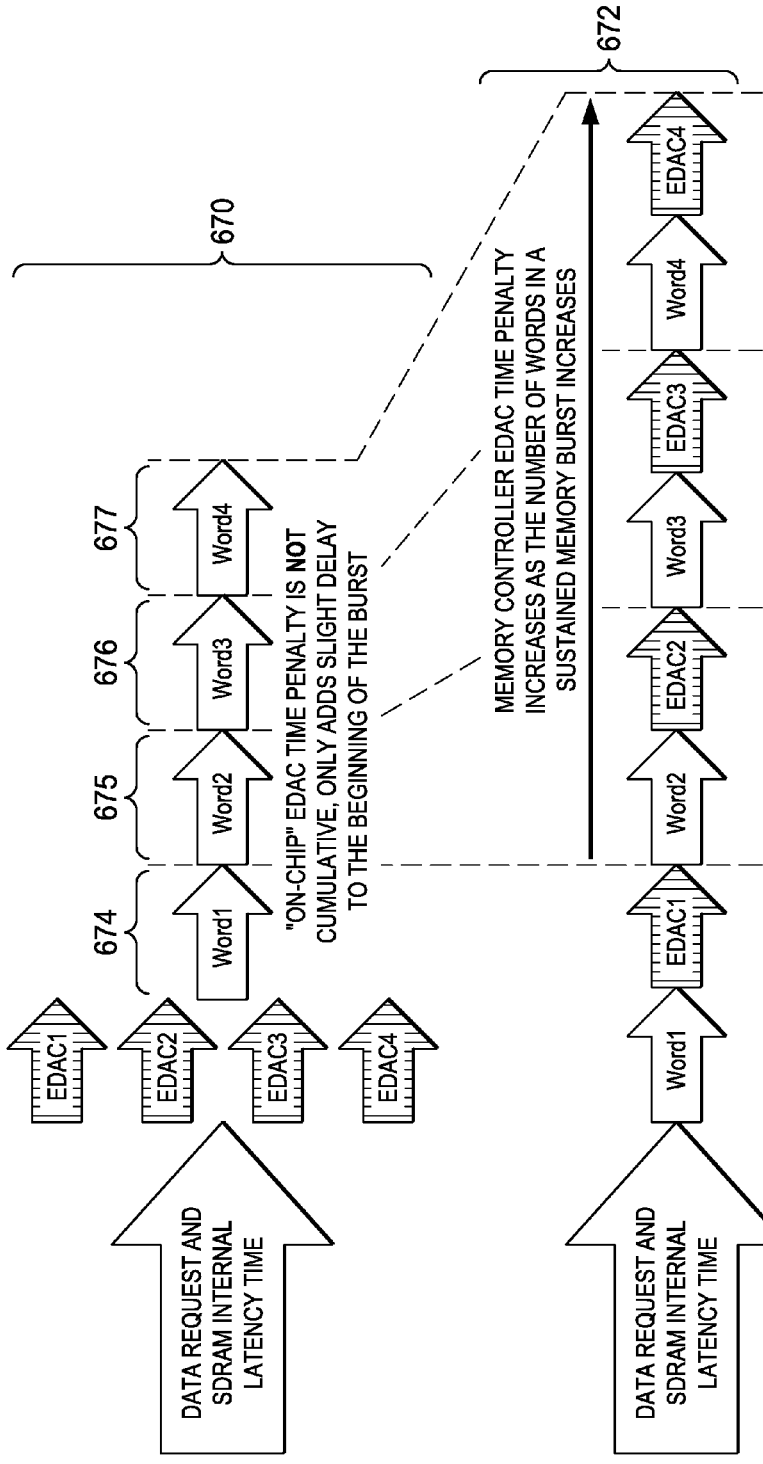
FIG. 11 is a diagram depicting performance improvement achievable using multiple parallel EDAC circuits in a memory circuit.

Thirdly, such a memory device can perform multiple EDAC operations in parallel, minimizing the impact of the EDAC function on data throughput performance. For example, when using a single EDAC engine, only one word can be corrected at a time. For high-performance burst-mode memories, a single EDAC circuit can become a performance bottle-neck. Using multiple EDAC engines (one per data word in a burst sequence), as depicted in FIG. 11 in section 670, allows a burst memory device to perform EDAC operations on all the words in the burst simultaneously, then transfer each word out at respective times 674, 675, 676, 677, to significantly reduce the impact of EDAC on burst performance.

Over time, independent errors can accumulate in a memory device. As errors accumulate, the probability that multiple independent errors will occur within a single data word increases. This eventually results in too many errors within a data word for EDAC to successfully correct. In order to prevent this from occurring, errors may be periodically removed from the memory array to prevent accumulation. Such a memory may be scrubbed by periodically scanning (i.e., accessing) all memory locations for errors, and when finding an error, using the EDAC circuit to calculate the uncorrupted data pattern, then writing the uncorrupted data pattern back into the memory location, thus overwriting the corrupted data. As used herein, a Scrub Engine is a circuit/system/program responsible for performing such a memory scrub. A scrub engine may be viewed as including an EDAC circuit and a scrub circuit that controls the scrubbing operation.

Figure 12:
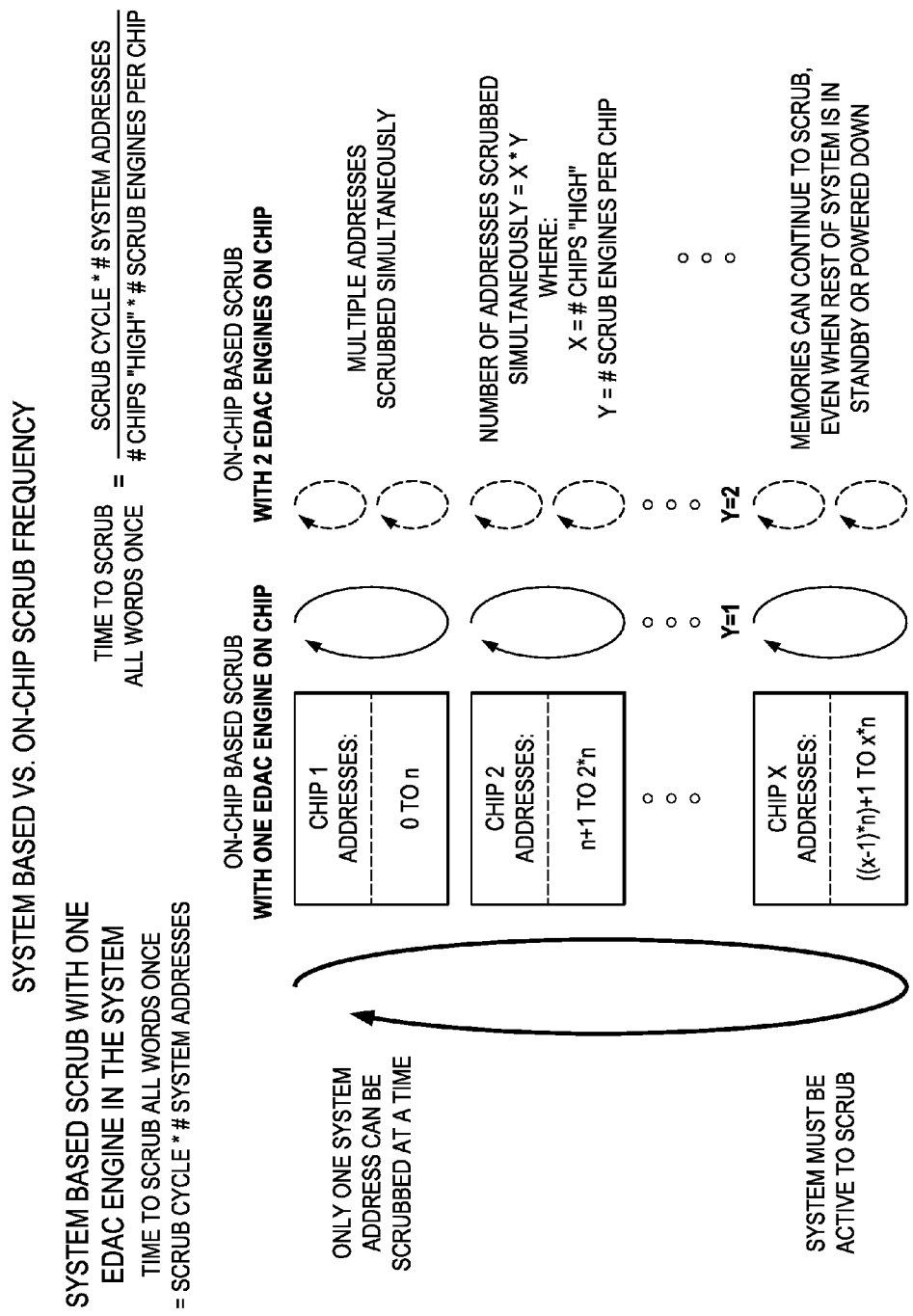
FIG. 12 is a diagram depicting performance improvement achievable using one or more EDAC circuits in each memory circuit of a memory system.

The performance of a memory integrated circuit may be improved by utilizing multiple EDAC/Scrub engines on the same integrated circuit. The performance advantage achievable in an example memory device having two scrub engines is depicted in FIG. 12. This allows the memory device to autonomously scrub errors while the device is not actively being accessed, or while it is performing other tasks. This also allows a larger number of data words to be scrubbed simultaneously, thereby reducing the required scrub frequency to prevent error accumulation, which in turn reduces the percentage of time the memory device is unavailable to the system due to scrub operations. Various example memory circuits that include more than one scrub engine are described below.

Figure 14:
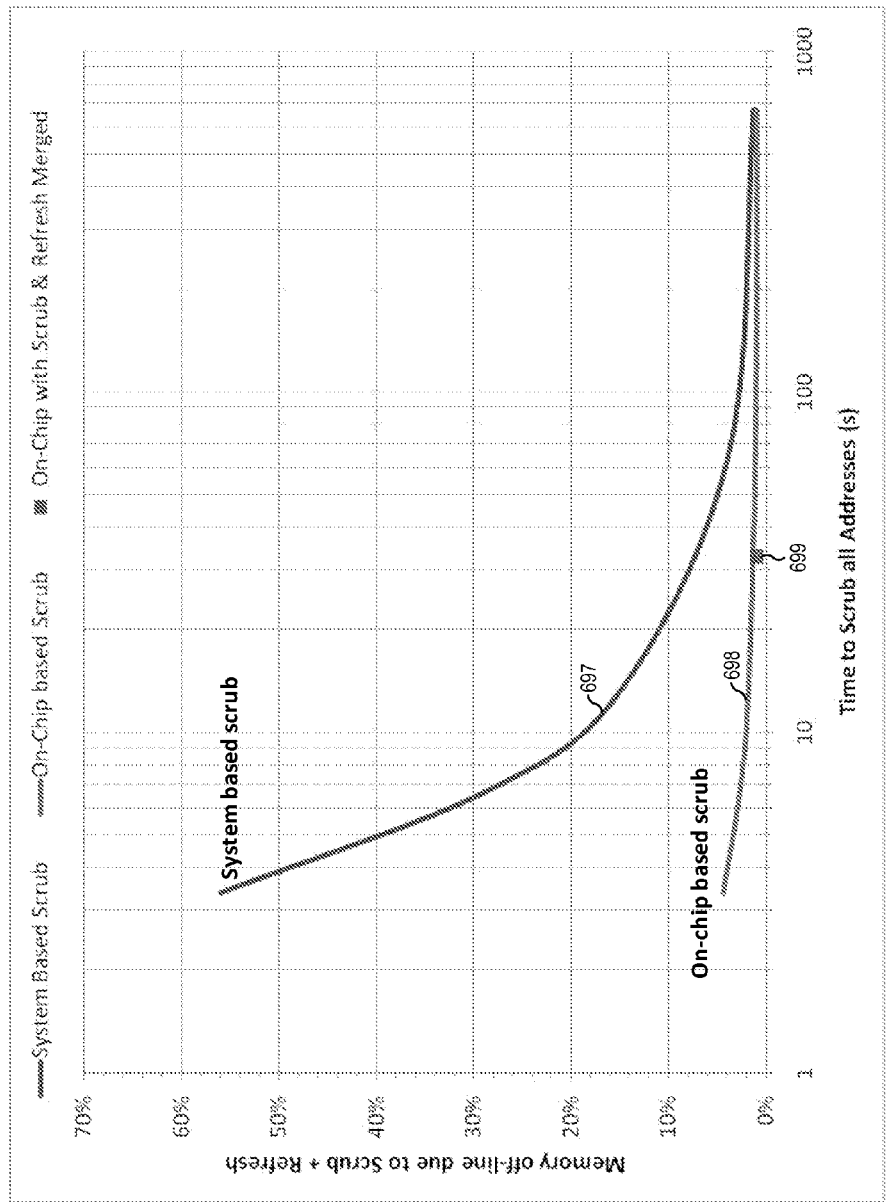
FIG. 14 is a diagram depicting performance improvement achievable on-chip memory scrub relative to a system memory scrub, as shown in FIG. 13.

For DRAM devices, such a scrub operation may be embedded within the normal DRAM refresh operation so that data is refreshed using error-corrected data, ensuring data integrity. This provides for a memory scrub that is transparent to the DRAM user (i.e., takes no additional time compared to normal refresh operation). A comparison between on-chip scrub versus system (external) scrub is shown in the table depicted in FIG. 13 for an example 2 GB memory sub-system. The significant performance improvement indicated in this table are graphed in FIG. 14. Curve 697 represents the scrub overhead for a system scrub, and curve 698 represents the scrub overhead for an on-chip-based scrub. Data point 699 depicts the result for an on-chip-based scrub merged with refresh.

A common architecture is to use a 32-bit word with 7 additional parity bits, but this may be broken up (or divided) into two half-words, each having 16 data bits and 6 parity bits, for a total of 44 bits for a 32-bit data word. This allows for the option to have either one scrub engine that scrubs all words (normal), or to have two scrub engines that run in parallel for a 2× reduction in scrub time. This also simplifies the ability to offer a variety of configurable word lengths; in particular, the half-sized word options are more easily designed within this architecture. In an example memory, operation is available with configurable word lengths of x16 and x32 (with or without EDAC); and x11, x22, and x44 (without EDAC). Various example memory circuits are described below.

Without a BGR structure present in the silicon structure of the circuit, the effects of an SEU would continue to be enhanced and would exhibit both MBU, SEFI, SEL or SET behavior, and the overall performance of any circuit element (whether it be an SRAM bit cell, a register cell, or CMOS logic circuit) would fail. As a result, the circuit would exhibit an electrical reaction after being struck by the SEU particle and would upset DICE cells, EDAC circuits, or scrubbing circuits, preventing them from operating error-free. Such circuits could not be depended on and used effectively and reliably in a radiation environment to repair memory (non-DICE) bit cells to their correct values when directly struck by the SEU particle (e.g., heavy ion, neutron, proton, X-ray or gamma-ray, or other nuclear particles which could exhibit spallation behavior). Conventional DICE cells, EDAC circuit blocks, and or SCRUB circuits all would likely fail in the presence of radiation effects if not protected by some means. The BGR structure may be incorporated within the silicon material itself during manufacture of the CMOS circuit to better protect the DICE cells from the parasitic charge sharing, and thus protect other larger circuits which include these DICE cells, such as the EDAC circuit or SCRUB circuit.

Figure 15:
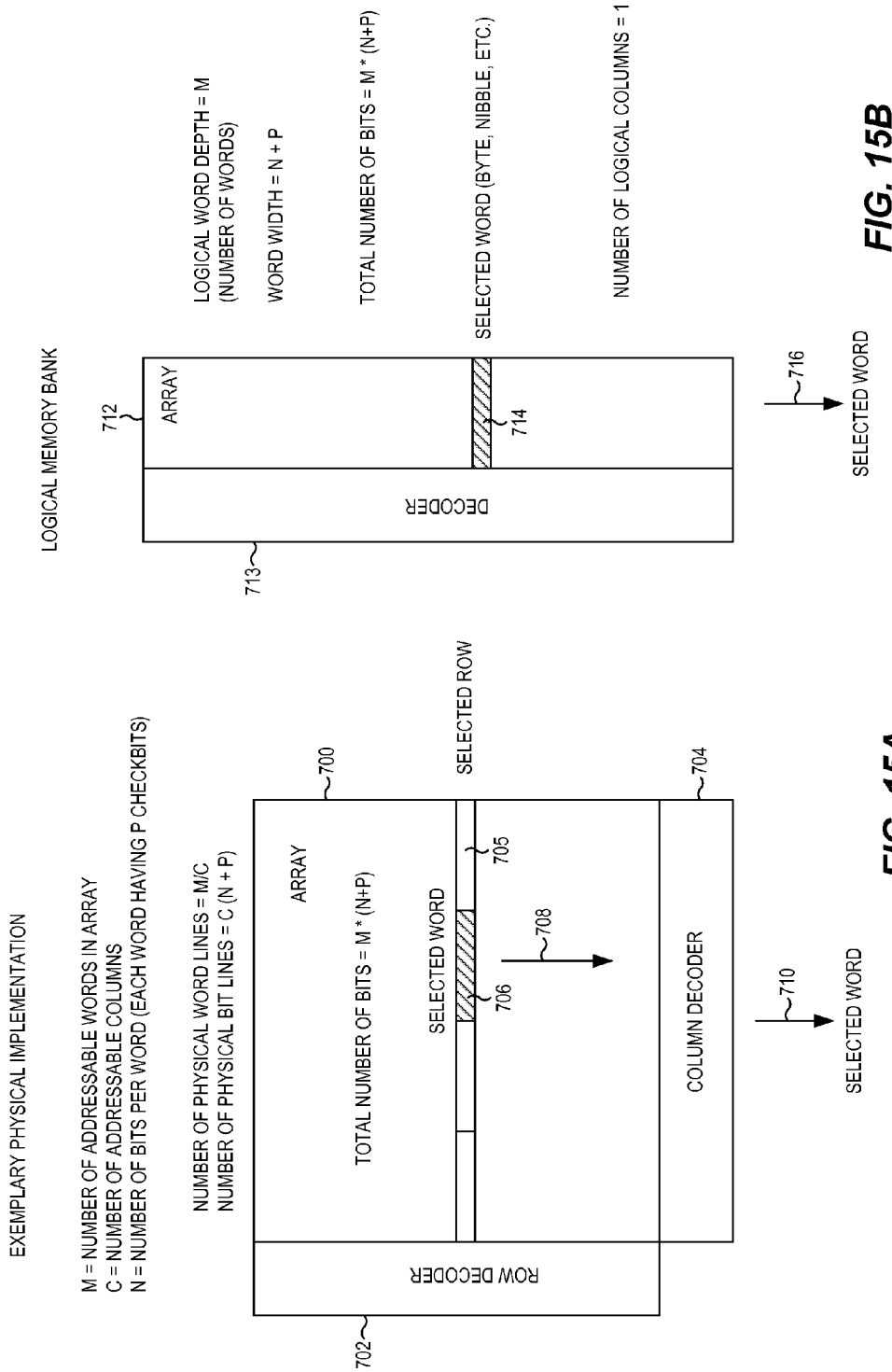
FIG. 15A is a block diagram depicting an example physical implementation of a memory array.
FIG. 15B is a block diagram depicting an example logical memory bank.

FIG. 15A depicts a block diagram of an example physical implementation of a memory array 700. A row decoder 702 decodes a plurality of row addresses (not shown) and selects one selected row 705 within the array 700. A column decoder 704 decodes a plurality of column addresses (not shown) and selects one selected column 708 within the array 700. The selected column 708 may include one or more individual bit lines. In this example, the selected column includes several bit lines, such as 8 bit lines, and is thus operable to simultaneously read or write an 8-bit selected word 706, which may be conveyed (arrow labeled 710) to I/O circuits (not shown). The memory array 700 is thus selectable in two dimensions using both row and column addresses.

Such a memory array 700 may be viewed as a single logical (or "linearized") memory bank 712, as shown in FIG. 15B, having the same number of addressable words M, but only one column. The decoder 713 may correspond to the address decoders 702, 704. The selected word 716 is the same width as the selected word 710, which may include a number N of data bits, and a number P of check bits.

FIG. 16 is a block diagram depicting an embodiment of a memory circuit having two memory banks 722, 724, two R/W circuits 730, 732, two EDAC circuits 734, 736, and one scrub control circuit 744 that controls scrub operation for both memory banks 722, 724. An access control circuit 728 provides addresses (and various control signals) to a single decoder 726 that is used to select a selected word 714 in each of the memory banks 722, 724. Thus, both memory banks 722, 724 are addressed together, and may be viewed as a single "array". EDAC circuit 734 receives N+P bits from the memory bank 722 by way of R/W circuit 730, and writes N+P bits into the memory bank 722, but conveys N-bits to/from input/output circuit 738. EDAC circuit 736 receives N+P bits from the memory bank 724 by way of R/W circuit 732, and writes N+P bits into the memory bank 724, but conveys N-bits to/from input/output circuit 740. Thus, each memory bank 722, 724 corresponds to a separate EDAC sub-group of the total memory array.

Figure 10:
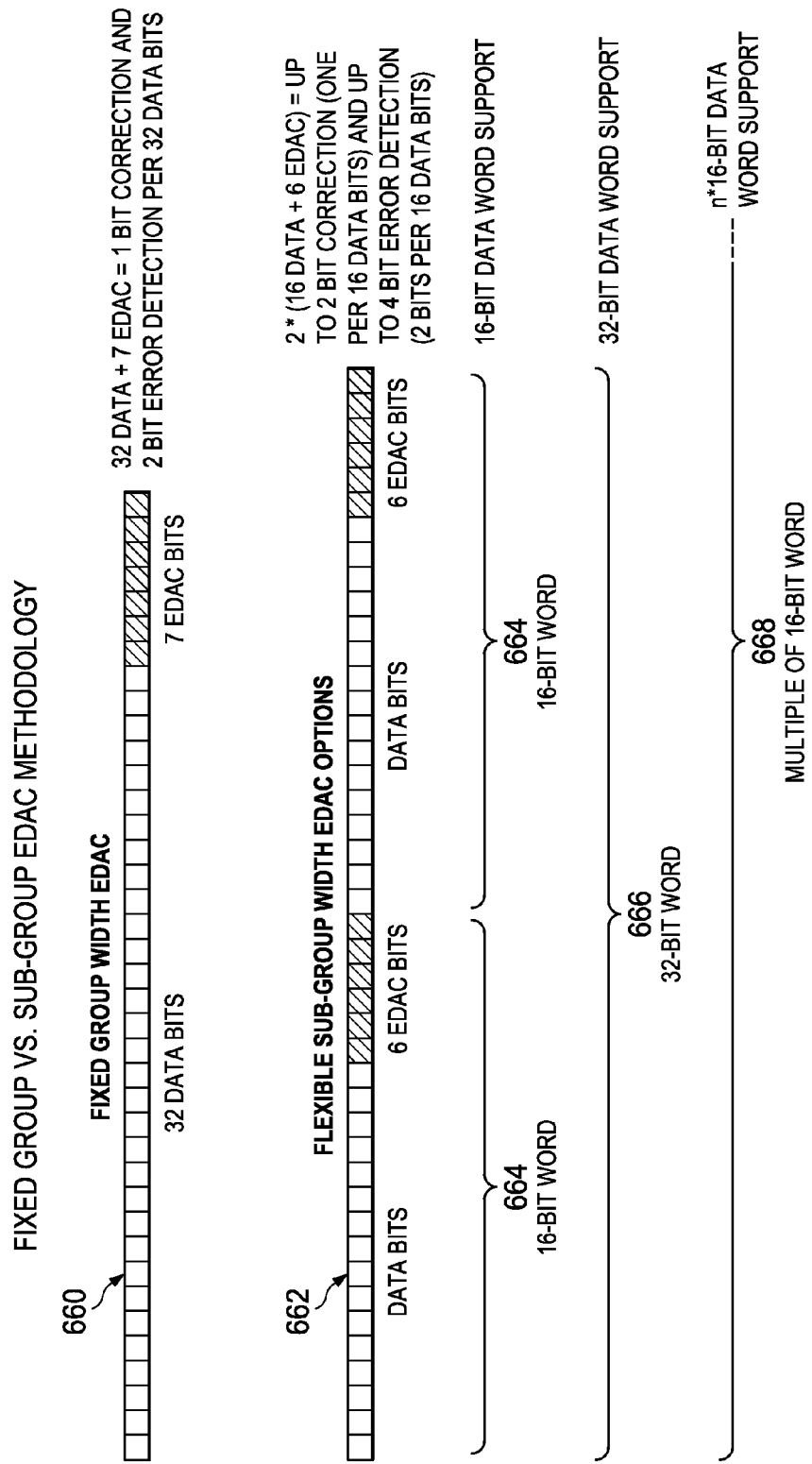
FIG. 10 is a block diagram depicting a flexible sub-group width error detection and correction (EDAC) methodology.

By splitting the memory array into two sub-groups (i.e., memory banks 722, 724), each with a respective EDAC circuit 734, 736, the memory circuit achieves better EDAC SEU performance, as described above (e.g., in regards to FIG. 10). As shown, both N-bit data words are conveyed as a single 2N-bit external data word 742. However, this organization more easily provides for configurable input/output circuits 738, 740, to provide an N-bit external data word, without impacting the internal EDAC configuration. Such features are also described above in regards to FIG. 10.

Figure 17:
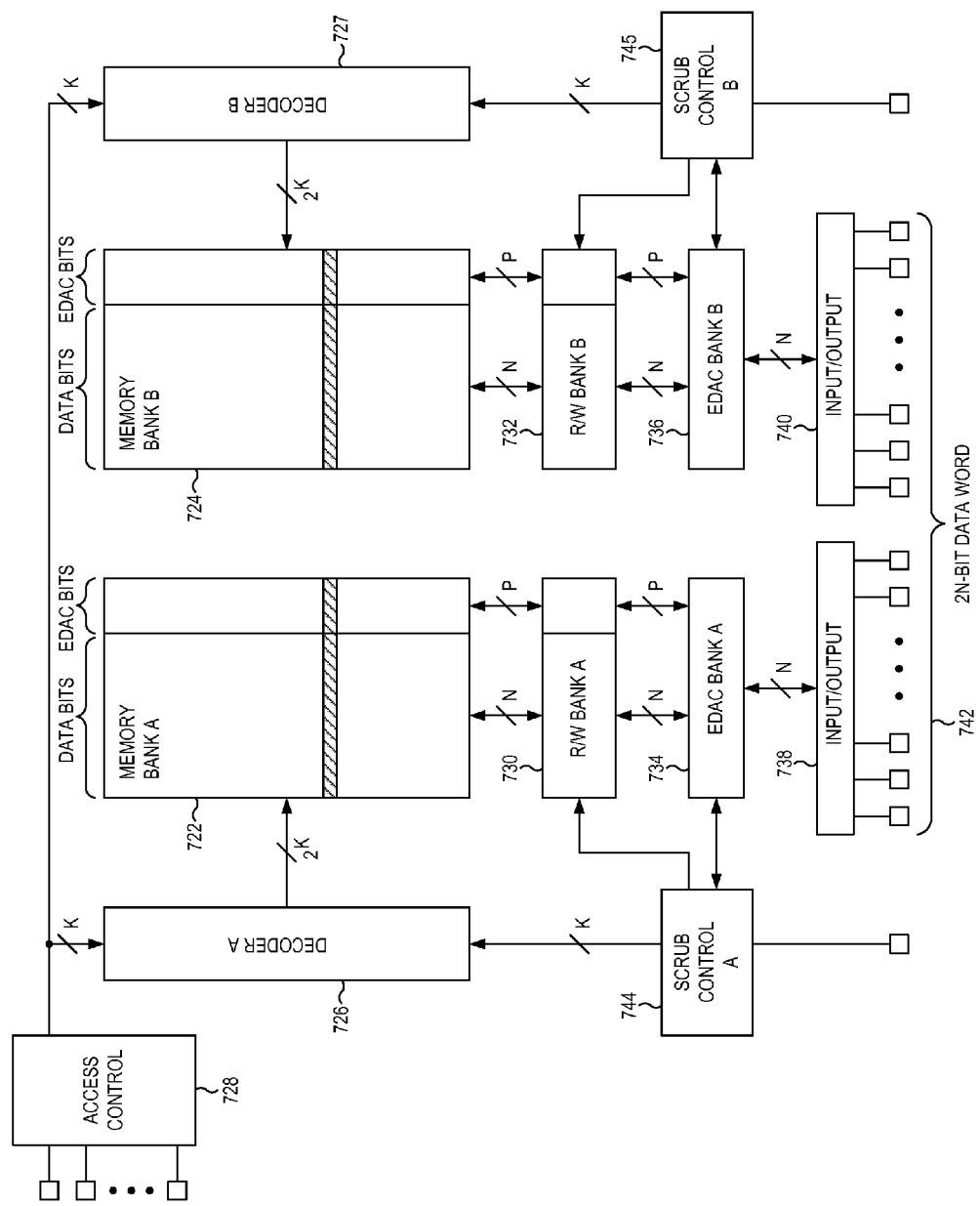
FIG. 17 is a block diagram depicting an embodiment of a memory circuit having two EDAC circuits and two scrub control circuits.

FIG. 17 is a block diagram depicting an embodiment of a memory circuit having two scrub engines. A second decoder 727 also receives address and control signals from the access control circuit 728 and from scrub circuit 745, and each decoder 726, 727 provides word selection for its respective memory bank 722, 724. By adding the second scrub circuit 745, each of the two memory banks 722, 724 is now associated with a respective EDAC circuit 734, 736, and a respective scrub circuit 744, 745, and thus two independent scrub engines are provided, each respectively controlling scrub operation for each respective memory bank 722, 724. In some cases, this also can provide for independent operation of each memory bank 722, 724, such as scrubbing one memory bank while accessing the other.

Figure 18:
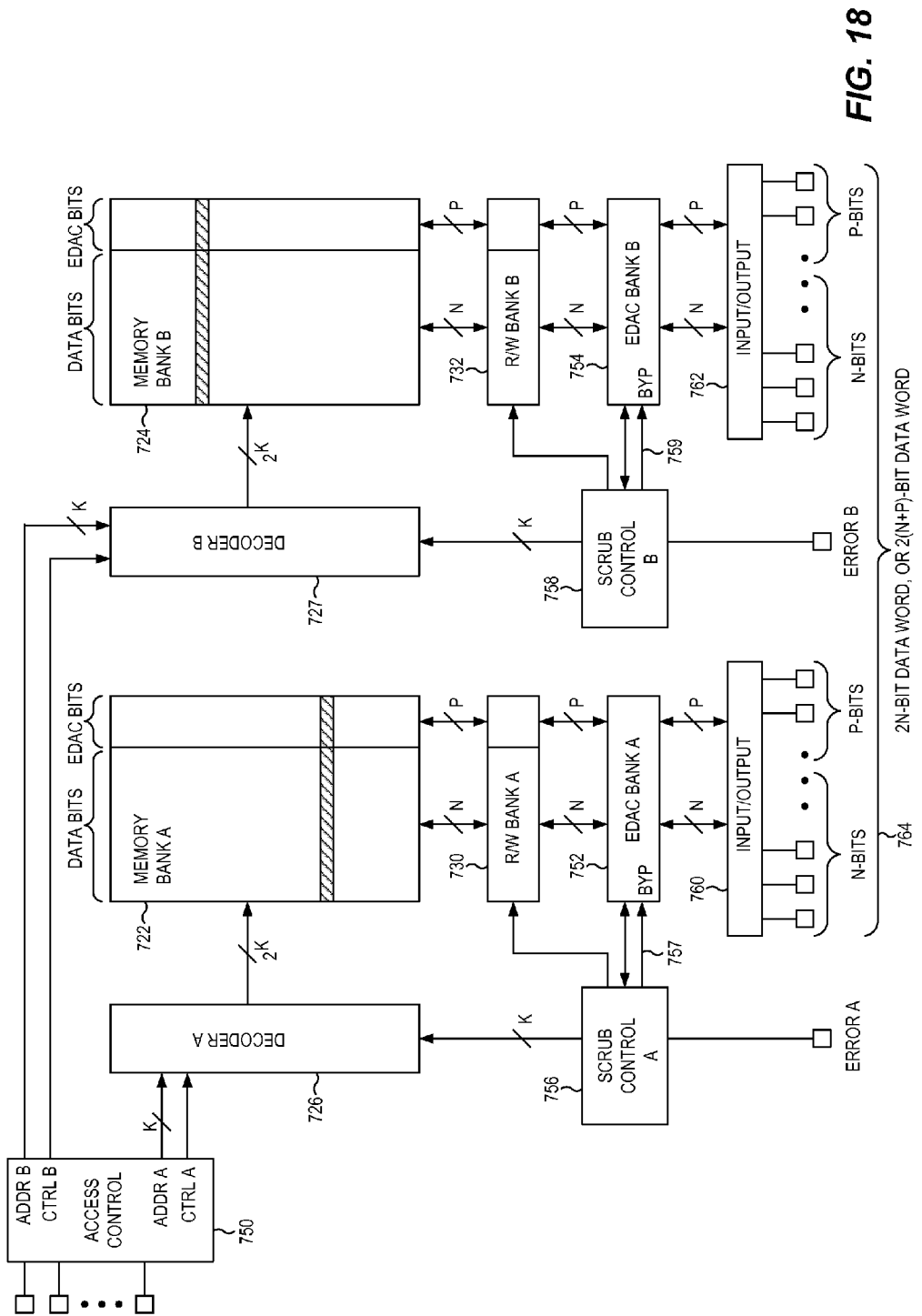
FIG. 18 is a block diagram depicting another embodiment of a memory circuit having two EDAC circuits and two scrub control circuits.

FIG. 18 is a block diagram depicting another embodiment of a memory circuit having two EDAC circuits and two scrub control circuits. An access control circuit provides respective address and control signals for each respective decoder 726, 727. This provides for even more independent operation of the two memory banks EDAC circuit 752 receives N+P bits from the memory bank 722 by way of R/W circuit 730, and writes N+P bits into the memory bank 722, and also conveys N+P bits to/from input/output circuit 760. EDAC circuit 754 receives N+P bits from the memory bank 724 by way of R/W circuit 732, and writes N+P bits into the memory bank 724, and likewise also conveys N+P bits to/from input/output circuit 762. As shown, both N+P bit data words may be conveyed as a single 2N-bit external data word 764 (if using EDAC) or as a 2(N+P)-bit external data word (if not using EDAC). A respective bypass control input to EDAC circuits 752, 754 may be provided by respective scrub circuits 756, 758 to enable or disable EDAC operation.

Figure 19:
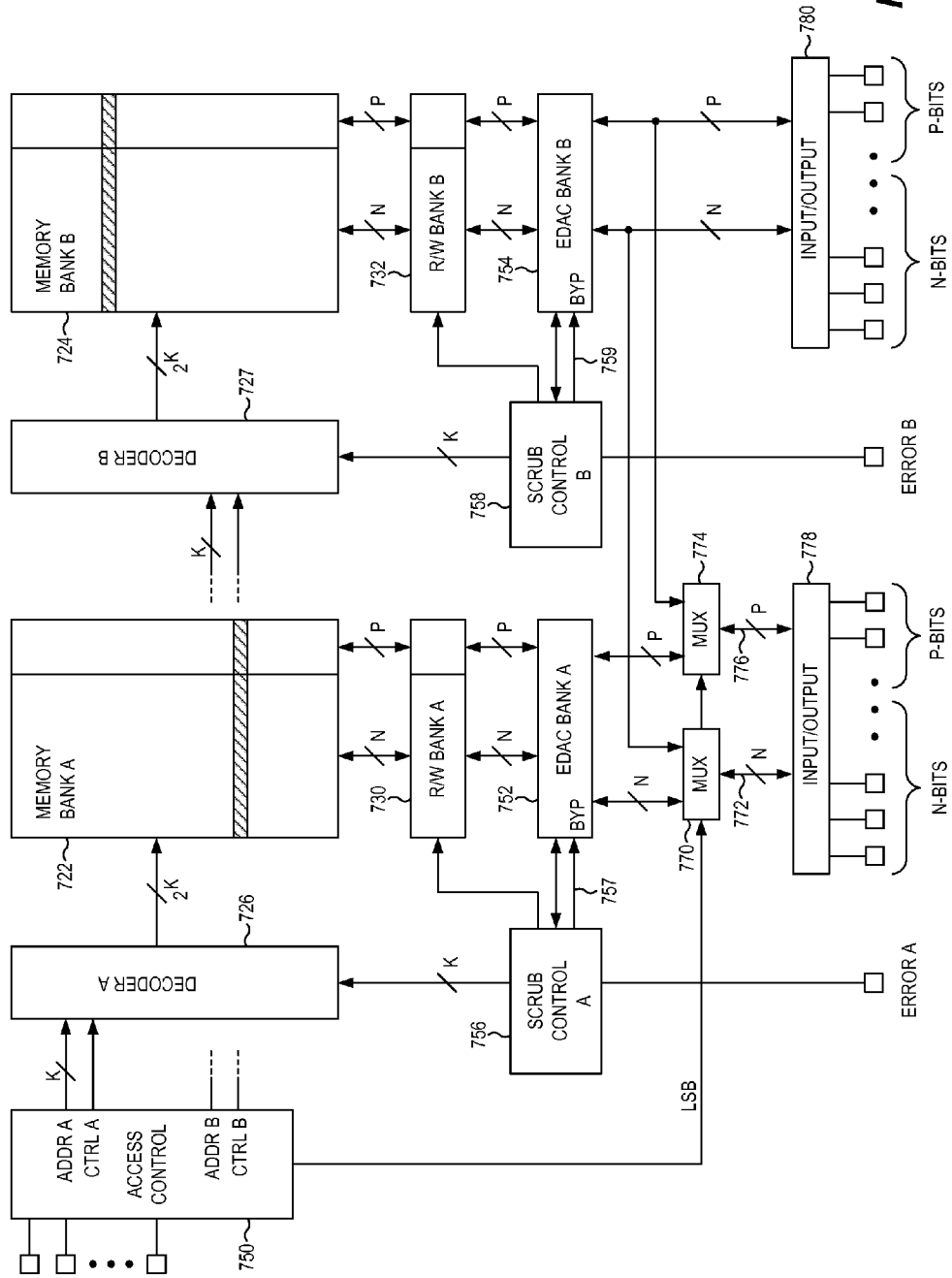
FIG. 19 is a block diagram depicting yet another embodiment of a memory circuit having two EDAC circuits and two scrub control circuits.

FIG. 19 is a block diagram depicting yet another embodiment of a memory circuit having two scrub engines. A multiplexer 770 conveys N-bits to/from EDAC circuit 752, and conveys N-bits to/from EDAC circuit 754, and based upon a control input (e.g., an address LSB) from access control circuit 750, conveys N-bits 772 to/from input/output circuit 778. Similarly, a second multiplexer 774 conveys P-bits to/from EDAC circuit 752, and conveys P-bits to/from EDAC circuit 754, and conveys P-bits 776 to/from input/output circuit 780. Thus, such a circuit can easily provide an external word width of N or 2N if using EDAC, or an external word width of (N+P) or 2(N+P) if not using EDAC. In some embodiments, a memory circuit can configured to provide any of several different word widths, including 16-bit or 32-bit (using EDAC), and 22-bit or 44-bit (without EDAC). If another set of 2:1 multiplexers is provided in the data path between multiplexers 770, 774 and input/output circuit 778, such a circuit can also provide a ½*(N+P) word width (without EDAC), such as an 11-bit word width.

Figure 20:
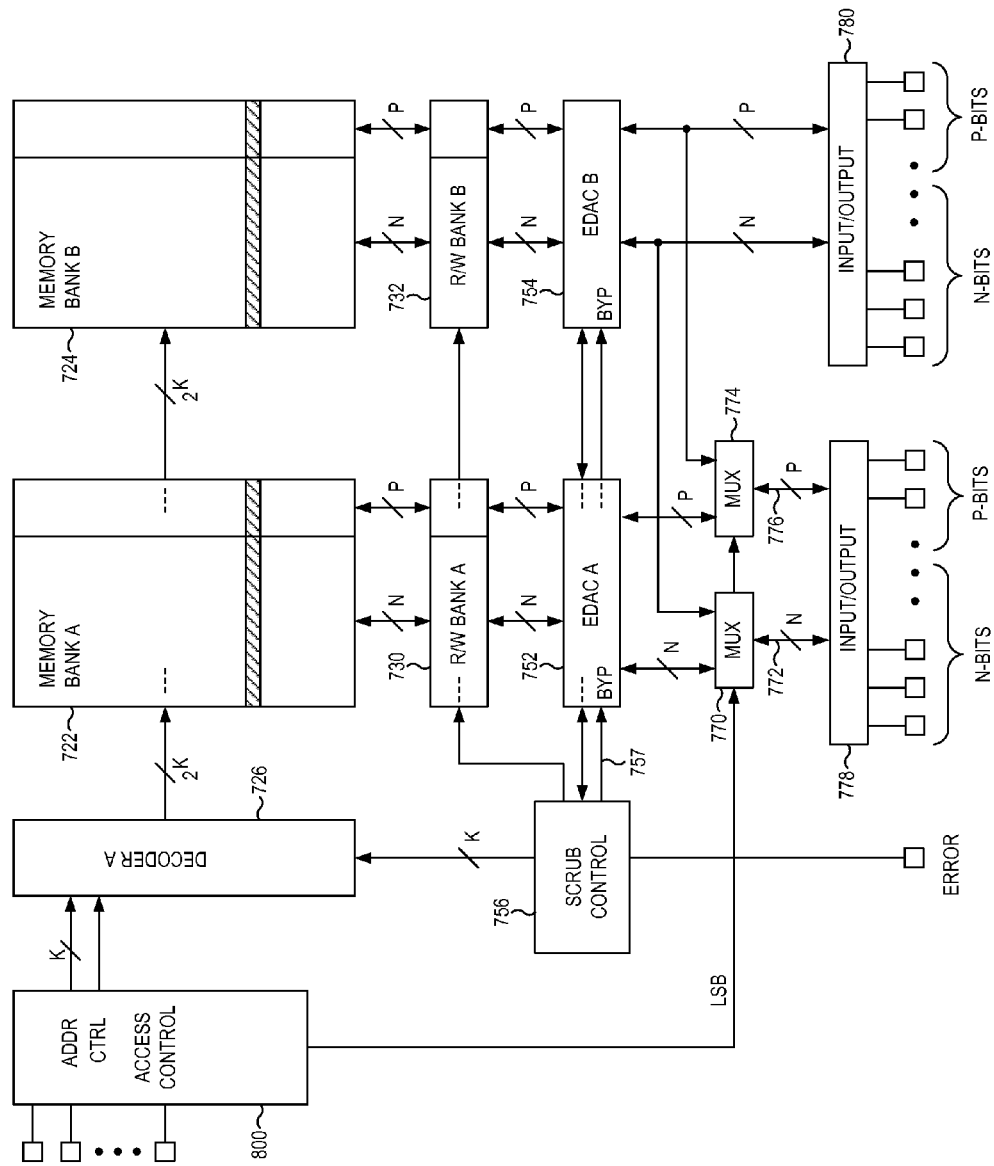
FIG. 20 is a block diagram depicting another embodiment of a memory circuit having two EDAC circuits and one scrub control circuit.

FIG. 20 is a block diagram depicting another embodiment of a memory circuit having similar capabilities of a configurable external word width, but with only one scrub engine (although with two EDAC circuits). As with the example memory circuit shown in FIG. 16, a single decoder 726 provides memory word selection for both memory banks 722, 724.

Figure 21:
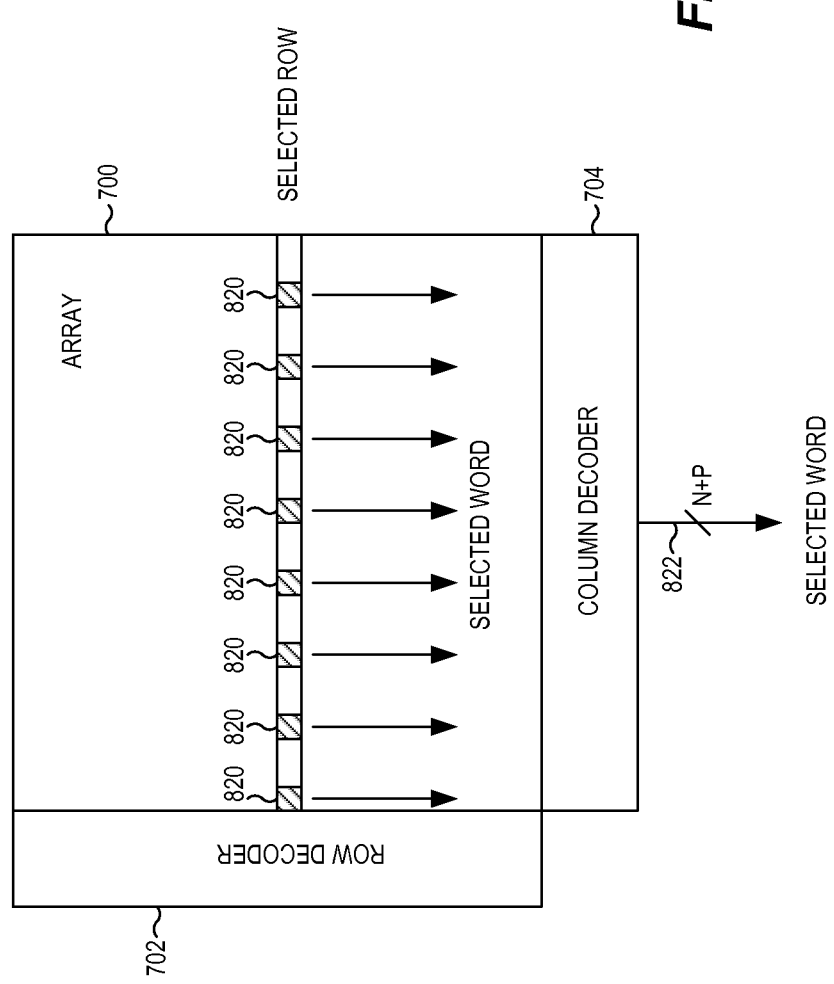
FIG. 21 is a block diagram depicting bit separation within a memory word.

FIG. 21 is a block diagram depicting bit separation within a memory word. In any of the examples circuits described herein, it is useful for the bits in a given memory word to be spaced apart from each other, so that a single strike has a much lower chance of affecting more than one bit in a single EDAC word (e.g., N+P bits). As shown, a selected word includes multiple bits 820, each spaced apart from the other in the memory array 700. In example memory arrays, such may be accomplished using column decoder circuits that simultaneously select non-adjacent bit lines, such as selecting one bit line for each group of J bit lines.

Exemplary SRAM memory circuits may include both internal EDAC circuitry and SCRUB circuitry. The memory may be operated with EDAC and SCRUB disabled, with EDAC enabled and SCRUB disabled, or with EDAC and SCRUB enabled.

EDAC circuitry (when enabled) will internally detect single bit errors within a 32-bit word as the word is read and deliver error free data to the SRAM output. Without a scrub circuit, the EDAC circuit will not repair bit errors in the storage array, so in applications where array data is changed infrequently, bit upset errors can accumulate over time, eventually creating multiple bit errors in a single word. Multiple bit errors in a single word are detected using EDAC, but cannot be compensated for. When multiple bit errors within a word are detected, a multiple-bit-error (MBE) pin on the SRAM is set, signaling the system that a multiple bit error has been detected.

To mitigate such an accumulation of bit errors over time in infrequently changed data, enabling the SCRUB circuitry allows the SRAM to locate single bit errors in the storage array and rewrite the correct (original) data into these bit error locations. SCRUB employs EDAC's ability to identify words with single bit errors and determine the correct data to be re-written into these words. The SCRUB may be enabled to run in the background at one of several predefined SCRUB frequencies, or may be momentarily enabled by the system to perform a single scrub operation at times of the system's choosing, or may be disabled.

To reduce the possibility of multiple bit upsets within a single 32-bit word, each bit of the word is separated spatially across the storage array, effectively eliminating the possibility of a single particle strike from upsetting more than a single bit within each word.

Finally, and still with respect to certain exemplary SRAM memory circuits, the EDAC and SCRUB circuits are both hardened-by-process (e.g., BGR, PID) and incorporate moderate design hardening techniques (e.g., spatial redundancy) to significantly (a) reduce the circuit's sensitivity to total ionizing dose (TID); (b) improve the circuit's does-rate performance; and (c) reduce the SEU cross section of a particle strike.

External Parity with Internal EDAC

Figure 22:
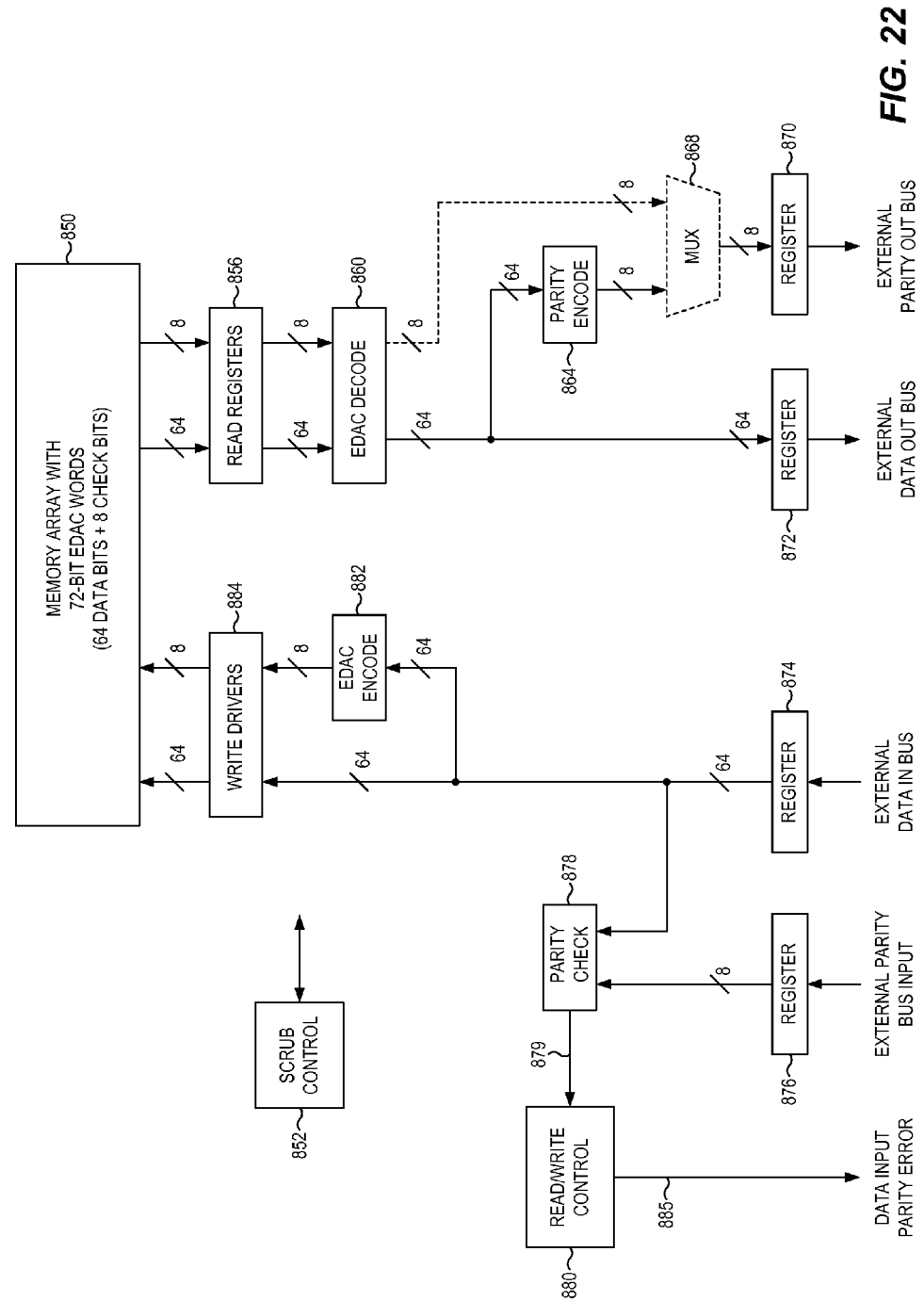
FIG. 22 is a block diagram of a memory circuit that provides internal EDAC and external byte parity.

Referring now to FIG. 22, an exemplary memory device shown incorporates external byte parity checking for the input data, generation of internal EDAC, and generation of external byte parity for the output data. In the exemplary device shown, a 64-bit external data word is assumed, although other word widths may be implemented. A parity bit is included for each 8-bit byte in the external data word, for a total of 8 parity bits.

The memory array 850 represents a linearized abstraction of one or more memory arrays, as described in regards to earlier figures, and any such physical arrangements may be chosen. In this example, the memory array 850 provides for a 72-bit wide EDAC memory word (i.e., storing a 64-bit data word and 8 EDAC check bits).

A selected word from the memory array 850 may be read into read registers 856, which includes a 64-bit portion corresponding to the data word and an 8-bit portion corresponding to the check bits. A selected word may be written into the memory array 850 by way of write drivers 884, which includes a 64-bit portion corresponding to the data word and an 8-bit portion corresponding to the check bits. These separate write and read paths are shown as a conceptual simplification of actual read/write circuitry, which may utilize shared R/W busses, decoder circuitry, etc., as is known in the art, but nonetheless provides a useful conceptual abstraction for the description here, which need not impose specific implementation details of the memory read and write circuits.

The memory device receives into register 874 a 64-bit data word from an external data input bus, and receives into register 876 a corresponding 8-bit parity byte from an external parity bus input. The data word parity is checked by parity check circuit 878, and an error signal 879 may be conveyed to a read/write control circuit 880. If a parity error is determined in the data input, the read/write control 880 can request retransmission of the data word by assertion of a data input parity error signal 885 to the computational block that provided the data to be written. Such a computational block may be a processor that is implemented on an integrated circuit that is external to the memory device, may be a processor implemented on the same integrated circuit as the memory device, may be a processor within a module that includes multiple integrated circuits bonded together, or any number of other variations.

The parity information is used to guard against errors that occur "in-flight" from the computational block, sometimes also called bus transmission errors, but the parity information is not stored internally in the memory array 850. Rather, far superior data protection may be achieved by instead computing EDAC check bits corresponding to the same 64-bit data word, and storing all 72 bits in the array. To accomplish this, the 64-bit data input word is conveyed to EDAC encode block 882 which generates 8 EDAC check bits, and the data word and check bits are written to the memory array 850 by way of the write drivers 884.

A scrub control circuit 852 may be included, which serves to periodically scrub through the memory array 850 to correct any errors before accumulation effects result in uncorrectable multiple-bit errors, as described above, and thus maintains "known good" data in memory array 850. Any number of scrub engine arrangements may be employed, including those described above in regards to earlier figures. Even though the data input parity information was not stored in the memory array 850, since "known good" data was stored and maintained in the memory array 850, the external byte parity may be re-calculated when the data is outputted.

Data is read from the memory array 850 into read registers 856 (which may represent a buffer, latch, register, read bus, or other block representing a data out path from the memory array 850). The 72-bit wide EDAC data word is conveyed to EDAC decoder 860, which corrects any single bit error within the 72-bit EDAC data word. Corrected read data is then conveyed to register 872, and also conveyed to parity encoder 864, whose 8-bit output is conveyed to register 870. Thus, the data word read from the memory array is provided onto an external data out bus, and the corresponding parity byte is provided onto an external parity out bus. An optional multiplexer 868 may be implemented to provide the internally generated EDAC check bits onto the parity out bus.

As mentioned before, this exemplary arrangement is shown using a 64-bit data word (and correspondingly, an 8-bit parity byte and 8 EDAC check bits). Other word widths are also contemplated, including external word widths that are narrower than the EDAC word width in the memory array. However, the 64-bit example is particularly noteworthy in comparing this technique to a parity memory that stores the parity bits in the memory array. In this example memory device, same 8 extra memory bits that would have been required to store the parity bits in the memory array are instead used to store 8 EDAC check bits. This is a much more powerful data integrity construct than parity, yet requires no additional memory array overhead. It is especially powerful if a scrub engine is also implemented to maintain "known good" data in the memory array.

Internal EDAC with Partial Write

Figure 23:
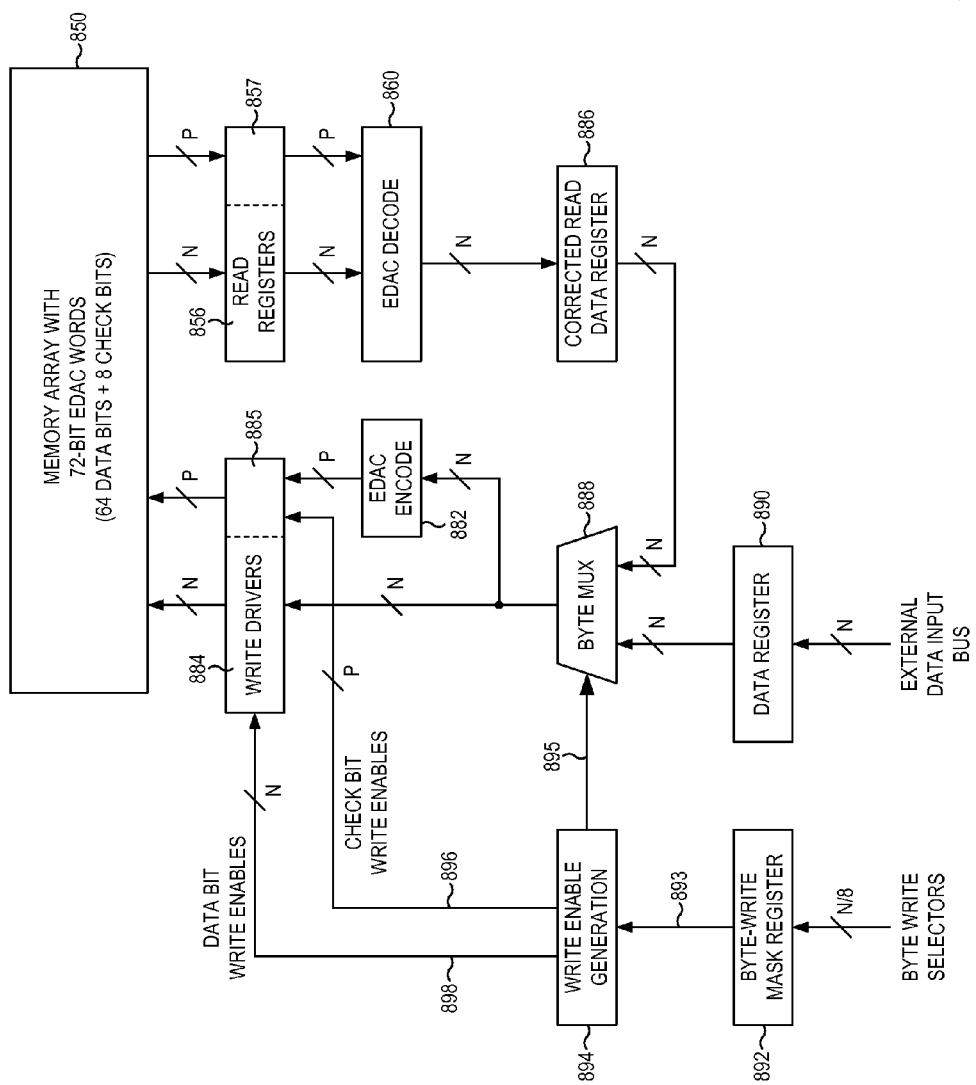
FIG. 23 is a block diagram of a memory circuit that provides internal EDAC and byte-write capability.

Referring now to FIG. 23, an exemplary memory device incorporates internal EDAC using a wide data word, but allows a partial write of the EDAC data word (i.e., a "byte write" capability). Such a capability is useful to reduce power dissipation when only some of the data bits need to be written during a given cycle. In the exemplary device shown, the memory array 850 provides for an (N+P)-bit wide EDAC memory word (i.e., storing an N-bit data word and P check bits). An N-bit external data word is assumed, although other word widths may be implemented, including an external data word width that is narrower than the EDAC word width in the memory array. A byte write control selector is included for each 8-bit byte in the external data word, for a total of N/8 such byte write control selectors.

In a partial write operation, new data is presented and conveyed to data register 890, and a group of byte selectors are conveyed to byte-write mask register 892. Any byte having an asserted byte write selector will be written. Since the EDAC is performed across a memory array word that is wider than the byte(s) to be written, and may even be wider than the external data bus word size, the partial write operation first retrieves into read registers 856, 857 existing data from the memory array 850, which is then corrected, if necessary, in EDAC decoder 860, then conveyed to a corrected read data register 886.

Since at least some of the data in the EDAC word will be re-written by this partial write operation, a new EDAC code is generated and also written to the memory array. The read data stored in the corrected read data register 886 is conveyed to a byte multiplexer 888. External data to be written is conveyed to a data register 890, whose output is also conveyed to the byte multiplexer 888. A write enable generation block 894 is responsive to the byte write selectors and conveys control signals 895 to the byte mux 888 to choose, for each respective byte position, either a respective byte from the input data register 890, or a respective byte from the corrected read data register 886. The resulting merged N-bit data word is then conveyed to the EDAC encoder 882 to generate a new set of P check bits. While this entire group of N+P bits could be re-written into the memory array 850, only the new byte(s) and the new EDAC check bits need be written. This may be accomplished by a plurality N of data bit write enable signals 898 coupled to write drivers 884, and a plurality P of check bit write enable signals 896 coupled to write drivers 885. These enable signals are generated by the write enable generation block 894, and each such enable signal corresponds to a particular data bit or check bit position within write drivers 884, 885.

Since the EDAC check bits are recalculated and will always need to be written, all the check bit enable signals 896 are asserted so that write drivers 885 actually write their corresponding check bits into the memory array 850. The data bit write enable signals 898 that correspond to the "new" data byte(s) to be written are asserted so that write drivers 884 actually write their corresponding data bits into the memory array 850, and remaining data bit write enable signals 898 remain non-asserted. This write operation may take place during a second memory operation or cycle after the initial read operation, or may take place overlapping a subsequent memory cycle in a pipelined manner. Thus, only the new EDAC check bits and the new data are actually written.

In the event the read data is actually corrected by EDAC decoder 860 before being stored into the corrected read data register 886, then additional data bits may need to be written back into the memory array 850. One way to accomplish this is to override the write enable generation block 894 and enable all the data bit write enable signals 898. Thus, even if the corrected data bit happens to fall in a byte that is not a "new" byte for this particular write operation, all the additional non-overridden read data from the corrected read data register 886 will also be written back into the memory array 850. Another way to accomplish is to compare the bit position of the corrected bit to the "new" byte positions selected for the partial write cycle, and only enable such a "corrected data write-back" if the corrected bit position falls outside the new byte positions. Such a write-back may be accomplished by writing back just the individual corrected bit, which would result in substantial savings in power dissipation, or may be accomplished by writing back the entire merged data word from the byte multiplexer 888.

Wide Internal EDAC with Narrower and Configurable External Data Word Width

Figure 24:
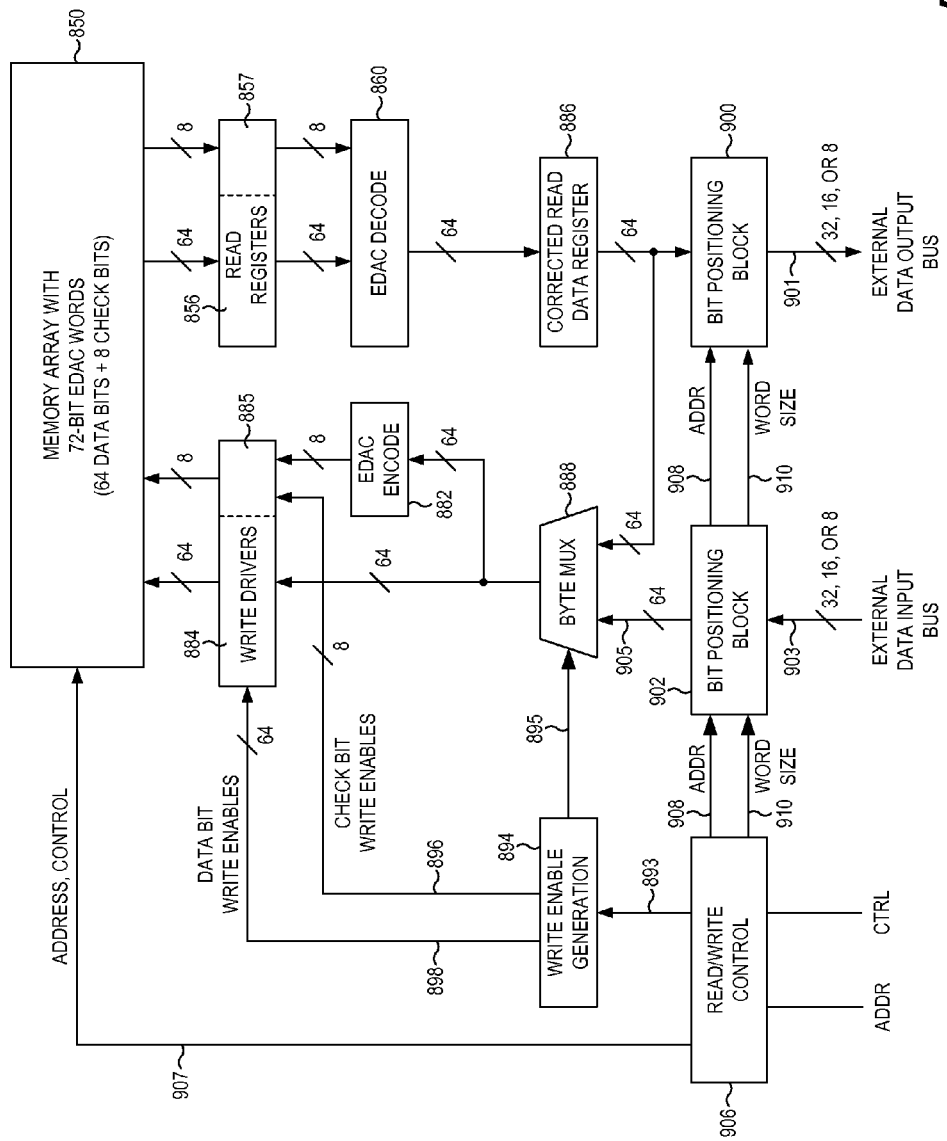
FIG. 24 is a block diagram of a memory circuit that provides internal EDAC and configurable external data word width.

The partial write techniques noted above may also be useful to provide for an external data word that is narrower than the internal EDAC data word, including an external data word having a configurable width. Referring now to FIG. 24, an exemplary memory device incorporates internal EDAC using a wide data word, but allows a partial write of the EDAC data word corresponding to a narrower external data word width. In the exemplary device shown, the memory array 850 provides for an 72-bit wide EDAC memory word (i.e., storing a 64-bit data word and 8 check bits). A configurable 32-bit, 16-bit, or 8-bit external data word width is assumed.

The data to be written is presented and conveyed to a bit positioning block 902, which performs a realignment so that the external data word aligns appropriately with the full 64-bit internal data word actually stored in the memory array 850. As before with the partial write described above, the EDAC is performed across a memory array word that is wider than the external data word to be written, the write operation first retrieves into read registers 856, 857 existing data from the memory array 850, which is then corrected, if necessary, in EDAC decoder 860, then conveyed to a corrected read data register 886.

The read data stored in the corrected read data register 886 is conveyed to the byte multiplexer 888. The realigned external data word at the output of the bit positioning block 902 is also conveyed to the byte multiplexer 888. The data realignment is responsive to a subset of the address information 908 and an indicator of the external data word width 910, which are both generated by a read/write control block 906. The write enable generation block 894 is responsive to similar signals 893, and conveys control signals 895 to the byte mux 888 to merge the appropriate group of data from the bit positioning block 902 into the read data from the corrected read data register 886. In other words, the byte mux 888 chooses, for each respective byte position, either a respective byte from the bit positioning block 902, or a respective byte from the corrected read data register 886.

The resulting merged 64-bit data word is then conveyed to the EDAC encoder 882 to generate a new set of 8 check bits.

While this entire group of 72 bits could be re-written into the memory array 850, only the "new" data corresponding to the external data word and the new EDAC check bits need be written. This may be accomplished by a plurality 64 of data bit write enable signals 898 coupled to write drivers 884, and a plurality 8 of check bit write enable signals 896 coupled to write drivers 885. These enable signals are generated by the write enable generation block 894, and each such enable signal corresponds to a particular data bit or check bit position within write drivers 884, 885.

Since the EDAC check bits are recalculated and will always need to be written, all the check bit enable signals 896 are asserted so that write drivers 885 actually write their corresponding check bits into the memory array 850. The data bit write enable signals 898 that correspond to the external data word to be written are asserted so that write drivers 884 actually write their corresponding data bits into the memory array 850, and remaining data bit write enable signals 898 remain non-asserted. This write operation may take place during a second memory operation or cycle after the initial read operation, or may take place overlapping a subsequent memory cycle in a pipelined manner. Thus, only the external data word and the new EDAC check bits are actually written.

In the event the read data is actually corrected by EDAC decoder 860 before being stored into the corrected read data register 886, then additional data bits may need to be written back into the memory array 850, as described above.

Also shown for the read path is a second bit positioning block 900, which provides an inverse data realignment operation during a read cycle. For example, if the external data word is a 16-bit word, and the address of the given memory cycle corresponds to data stored in bit positions 17-32 of the 64 bits within the selected memory word, the bit positioning block 900 shifts bits 17-32 to the appropriate data outputs 901. While address signal 908 and word size signal 910 are shown conceptually being conveyed to each of the two bit positioning blocks 900, 902, other implementations are contemplated, including conveying a group of signals that encodes the number of byte positions to be shifted in each of the bit positioning blocks 900, 902.

It may be noted that computing a group of eight EDAC check bits on a 64-bit word is more computationally complex, and takes more time, than computing a group of six EDAC check bits corresponding to a 16-bit data word. However, the array efficiency of using a 64-bit EDAC word is much better, requiring 13% (8/64) array overhead, instead of 38% (6/16) array overhead. In addition, if burst mode cycles are utilized, the EDAC decode operation that is required for a first array access also will have already ensured correct read data for additional sequentially-addressed memory cycles. For this 16-bit example, though it may take a little longer for the first 16-bit access, the next three 16-bit accesses may be provided very quickly and without any additional EDAC decode.

External Parity and Configurable Word Width Narrower Than Internal EDAC

Figure 25:
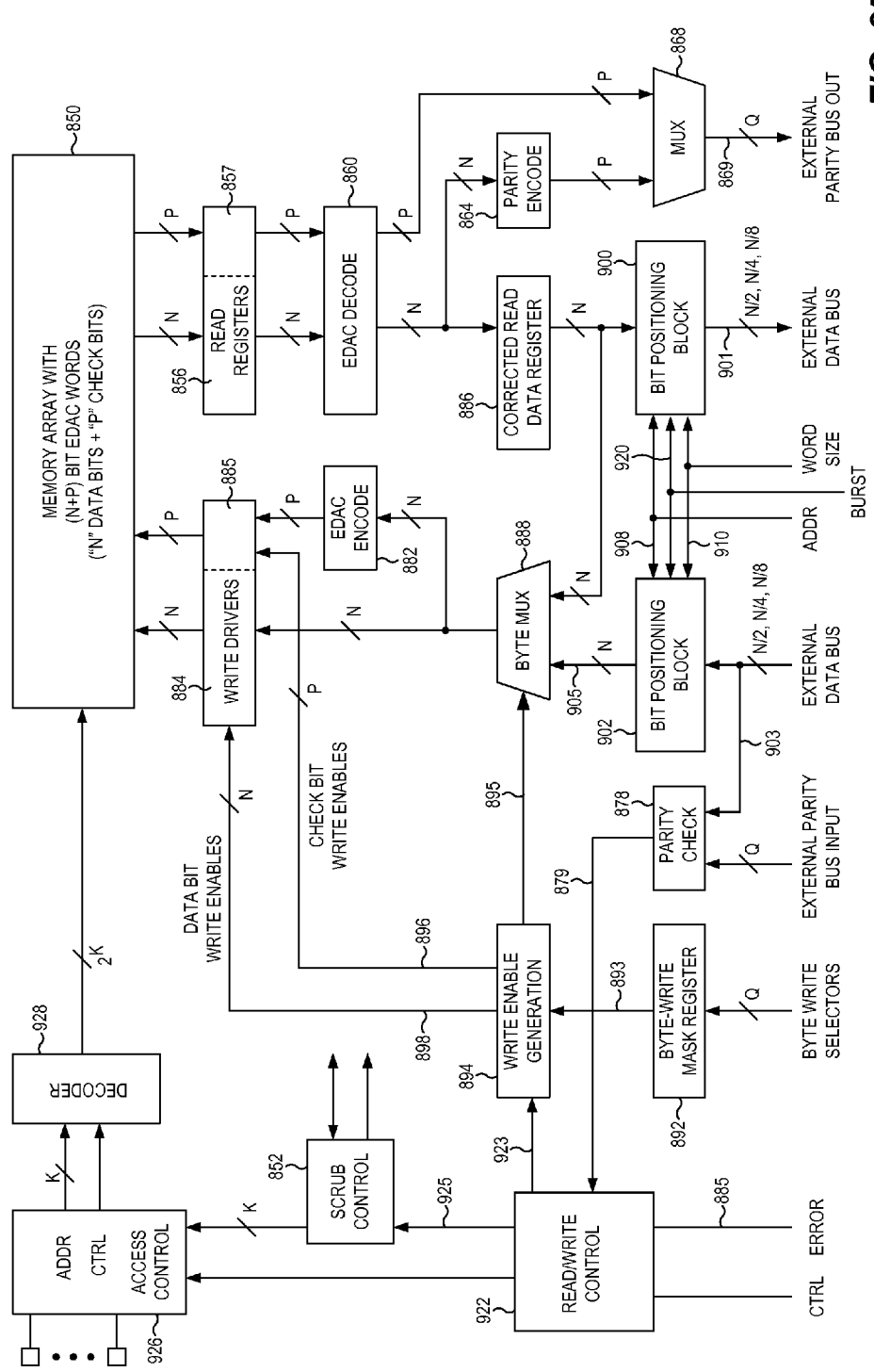
FIG. 25 is a block diagram of a memory circuit that provides internal EDAC, external byte parity, byte-write capability, and configurable external data word width.

Referring now to FIG. 25, an exemplary memory device incorporates the features described in preceding FIGS. 22, 23, and 24. Most of the blocks shown in FIG. 25 are depicted and described in one or more of the earlier figures, and will not be described again here. An access control block 926 and decoder block 928 correspond to exemplary blocks shown in earlier figures above, as does the scrub control block 852. It should be noted that the exemplary memory shown here includes a scrub data path (i.e., read/correct/write back path) that is usable by the scrub control block 852 to implement a full scrub engine. This scrub data path includes read registers 856, 857, EDAC decode 860, corrected read data register 886, byte mux 888 (controlled to select only the read data), the EDAC encoder 882, and the write drivers 884, 885. If desired, a direct data path may be incorporated from the EDAC decoder 860 to the write drivers 884, 885 to directly convey corrected data and check bits to the write circuits, and such a write need only be performed if the EDAC decoder 860 detects and corrects a bit error.

In the above several exemplary memory circuits, the memory array 850 incorporates a wide EDAC word rather than, as shown in regards to FIG. 16, breaking up large groups of data bits into smaller sub-groups, and utilizing multiple EDAC circuits (one per sub-group) to perform EDAC on each sub-group. Such a wide EDAC word, particularly when combined with a suitable scrub engine operating at a suitable frequency, may nonetheless provide ample error correction performance and serve to keep the memory array substantially error free. Such circuit arrangements also provide flexibility in what data group sizes (i.e., external data word widths) can be supported by such a memory device. Also, such wide EDAC words may be used in a high-performance burst-mode memory which performs an EDAC operation on all the words in the burst simultaneously when accessing the first word of the burst, then transferring each word out at respective times to reduce the impact of EDAC on burst performance.

Implementing a memory device using multiple memory array banks is useful to provide a hidden scrub of one bank during an external access of the other bank, as well as to enhance sequential performance by pipeline techniques using both banks Each bank may include its own independent scrub engine to allow the memory device to autonomously scrub errors while the device is not actively being accessed, or while it is performing other tasks.

As used herein, "access in a sequence" merely means cycling through all addresses to access all memory words, but not necessarily in any particular sequence or order. For example, such a sequence might be in binary order, gray code order, or some other order. As used herein, a "digital storage circuit" includes a latch, register, flip-flop, etc., which may be used to store a logic state in a digital circuit.

While many of the example circuits shown incorporate two memory banks, the concepts described herein may be utilized in integrated circuits having more than two memory banks While circuits and physical structures have been generally presumed in describing embodiments of the invention, it is well recognized that in modern semiconductor design and fabrication, physical structures and circuits may be embodied in a computer readable medium as data structures for use in subsequent design, simulation, test, or fabrication stages. For example, such data structures may encode a functional description of circuits or systems of circuits. The functionally descriptive data structures may be, e.g., encoded in a register transfer language (RTL), a hardware description language (HDL), in Verilog, or some other language used for design, simulation, and/or test. Data structures corresponding to embodiments described herein may also be encoded in, e.g., Graphic Database System II (GDSII) data, and functionally describe integrated circuit layout and/or information for photomask generation used to manufacture the integrated circuits. Other data structures, containing functionally descriptive aspects of embodiments described herein, may be used for one or more steps of the manufacturing process.

Computer-readable storage media include non-transitory, tangible computer readable media, e.g., a disk, tape, or other magnetic, optical, semiconductor (e.g., flash memory card, ROM), or electronic storage medium. In addition to computer-readable storage medium having encodings thereon of circuits, systems, and methods, the computer readable storage media may store instructions as well as data that can be used to implement embodiments described herein or portions thereof. The data structures may be utilized by software executing on one or more processors, firmware executing on hardware, or by a combination of software, firmware, and hardware, as part of the design, simulation, test, or fabrication stages.

The foregoing detailed description has described only a few of the many possible embodiments of the present invention. For this reason, this detailed description is intended by way of illustration, and not by way of limitations. Variations and modifications of the embodiments disclosed herein may be made based on the description set forth herein. It is only the following claims, including all equivalents, that are intended to define the invention.

What is claimed is:

1. A method of storing and retrieving data in a memory circuit providing error detection and correction (EDAC), said method comprising:
  receiving a plurality of data bits to be written and a plurality of parity bits corresponding to the data bits;
  parity checking the plurality of data bits and the plurality of parity bits for any parity errors;
  EDAC encoding a plurality of check bits corresponding to the plurality of data bits;
  storing the plurality of data bits and corresponding plurality of check bits as a first data group in a memory array without storing the plurality of parity bits in the memory array;
  retrieving the first data group from the memory array;
  EDAC decoding the retrieved first data group to provide an error-free corrected plurality of data bits corresponding to the retrieved first data group;
  computing a plurality of parity bits corresponding to the error-free corrected plurality of data bits; and
  conveying the error-free corrected plurality of data bits and corresponding plurality of parity bits to a requesting computational block.

2. The method as recited in claim 1 wherein:
  the plurality of data bits represents an external data word having a narrower word width than the data group into which the plurality of data bits is stored, and for which the plurality of check bits corresponds.

3. The method as recited in claim 1 further comprising:
  receiving a second plurality of data bits to be written and a corresponding second plurality of parity bits;
  parity checking the second plurality of data bits and the second plurality of parity bits for any parity errors;
  reading the first data group from the memory array;
  merging the second plurality of data bits into a portion of the first data group together with the first plurality of data bits;
  EDAC encoding the plurality of check bits corresponding to the merged first data group; and
  storing the merged data group with corresponding plurality of check bits into the memory array, without storing the second plurality of parity bits in the memory array.

4. The method as recited in claim 1 further comprising:
  periodically scrubbing the memory array to correct any accumulated errors from the memory array.

5. A memory circuit operable to perform the method as recited in claim 1.

6. A system comprising:
  a memory circuit operable to perform the method as recited in claim 1; and
  a computational block coupled to convey data to and retrieve data from the memory circuit.

7. A memory circuit comprising:
  a memory array;
  a parity check circuit operable to check for parity errors in a plurality of data bits and a corresponding plurality of parity bits received by the memory circuit;
  an EDAC encoder circuit operable to generate a plurality of check bits corresponding to the plurality of data bits;
  a write driver circuit operable to store the plurality of data bits and corresponding plurality of check bits as a first data group in the memory array;
  a read circuit operable to retrieve the first data group from the memory array;
  an EDAC decoder circuit operable to provide an error-free corrected plurality of data bits corresponding to the retrieved first data group; and
  a parity encoder circuit operable to compute a plurality of parity bits corresponding to the error-free corrected plurality of data bits.

8. The memory circuit as recited in claim 7 wherein:
  at least one of the parity check circuit, the EDAC encoder circuit, the EDAC decoder circuit, and the parity encoder circuit comprise spatially redundant circuitry.

9. The memory circuit as recited in claim 8 wherein:
  at least one of the parity check circuit, the EDAC encoder circuit, the EDAC decoder circuit, and the parity encoder circuit comprise radiation hardened process isolation (RHPI) structures.

10. The memory circuit as recited in claim 9 wherein:
  the RHPI structures comprise at least one of buried guard ring (BGR) and parasitic isolation device (PID) structures.

11. The memory circuit as recited in claim 7 further comprising:
  a scrub circuit coupled to the EDAC decoder circuit, and operable to periodically scrub accumulated errors from the memory array.

12. The memory circuit as recited in claim 11 wherein:
  at least one of the parity check circuit, the EDAC encoder circuit, the EDAC decoder circuit, the parity encoder circuit, and the scrub circuit comprise spatially redundant circuitry.

13. The memory circuit as recited in claim 12 wherein:
  the parity check circuit, the EDAC encoder circuit, the EDAC decoder circuit, the parity encoder circuit, and the scrub circuit comprise radiation hardened process isolation (RHPI) structures.

14. The memory circuit as recited in claim 13 wherein:
  the RHPI structures comprise at least one of buried guard ring (BGR) and parasitic isolation device (PID) structures.

* * * * *